(12) United States Patent
Hall et al.

(10) Patent No.: US 9,064,219 B2
(45) Date of Patent: Jun. 23, 2015

(54) SYSTEM AND METHOD FOR MANAGING FACILITY CONTENT AND EQUIPMENT INFORMATION

(75) Inventors: Eric Hall, Lee's Summit, MO (US); David L. Disney, Kansas City, MO (US)

(73) Assignee: J. E. DUNN CONSTRUCTION GROUP, INC., Kansas City, MO (US)

( * ) Notice: Subject to any disclaimer, the term of this patent is extended or adjusted under 35 U.S.C. 154(b) by 462 days.

(21) Appl. No.: 13/072,672

(22) Filed: Mar. 25, 2011

(65) Prior Publication Data

US 2011/0276886 A1 Nov. 10, 2011

Related U.S. Application Data

(60) Provisional application No. 61/331,472, filed on May 5, 2010.

(51) Int. Cl.
| | |
|---|---|
| *G06F 3/00* | (2006.01) |
| *G06Q 10/06* | (2012.01) |
| *G06Q 30/02* | (2012.01) |
| *G06F 17/50* | (2006.01) |

(52) U.S. Cl.
CPC ............ *G06Q 10/06* (2013.01); *G06Q 30/0283* (2013.01); *G06F 17/5004* (2013.01)

(58) Field of Classification Search
CPC . G06Q 10/06; G06Q 10/10; G06Q 10/06315; G06Q 30/0283; G06Q 10/103; G06Q 17/5004
USPC ........................................................ 715/736
See application file for complete search history.

(56) References Cited

U.S. PATENT DOCUMENTS

| | | | | |
|---|---|---|---|---|
| 6,009,442 | A * | 12/1999 | Chen et al. ..................... | 715/205 |
| 6,067,477 | A * | 5/2000 | Wewalaarachchi et al. ..... | 700/83 |
| 7,164,883 | B2 * | 1/2007 | Rappaport et al. ........... | 455/3.01 |
| 7,292,908 | B2 * | 11/2007 | Borne et al. .................. | 700/182 |
| 7,571,233 | B2 * | 8/2009 | Holloway, Jr. ................ | 709/227 |
| 7,698,647 | B2 * | 4/2010 | Steeb et al. ................... | 715/738 |
| 7,734,572 | B2 * | 6/2010 | Wiemeyer et al. .............. | 700/19 |

(Continued)

FOREIGN PATENT DOCUMENTS

WO 2006004649 A2 1/2006

*Primary Examiner* — Ryan Pitaro
(74) *Attorney, Agent, or Firm* — Husch Blackwell LLP

(57) ABSTRACT

A system and method that provides a unique building maintenance tool which leverages the information collected during the design and construction phase of the building lifecycle. User access BIMs, Revit schedules and other data sources within the unique construction process to provide clients with a post occupancy view previously unobtainable. The solution provides for simple integration with external data sources through data file import or direct integration. The intent of the data integration model is to reduce costs of ongoing implementations providing a scalable model. Mobile access to information is a central component of customer appeal and will be a focal point of the design process. With the present invention mobile users can use mobile devices to scan 2 dimensional barcodes or QR Codes or other georeferencing technologies including RFIDs, thereby using the mobile device as the primary navigation portal to room and equipment information and images. The present invention provides building management functionality by leveraging extracted building data of a database constructed from construction process data as a basis for data organization, which includes detailed equipment specifications.

30 Claims, 48 Drawing Sheets

(56) References Cited

U.S. PATENT DOCUMENTS

| | | | |
|---|---|---|---|
| 8,195,723 B2* | 6/2012 | Murdock et al. | 707/822 |
| 2005/0275525 A1* | 12/2005 | Ahmed | 340/524 |
| 2006/0031455 A1 | 2/2006 | Charron et al. | |
| 2006/0075718 A1* | 4/2006 | Borne et al. | 52/745.02 |
| 2008/0058970 A1* | 3/2008 | Perumalsamy et al. | 700/90 |
| 2008/0215413 A1* | 9/2008 | Barnard et al. | 705/9 |
| 2010/0010966 A1* | 1/2010 | Murdock et al. | 707/3 |
| 2010/0106543 A1* | 4/2010 | Marti | 705/7 |
| 2010/0241245 A1* | 9/2010 | Wiemeyer et al. | 700/19 |
| 2010/0241988 A1* | 9/2010 | Steeb et al. | 715/784 |
| 2011/0153103 A1* | 6/2011 | Brown et al. | 700/291 |
| 2011/0169826 A1* | 7/2011 | Elsberg et al. | 345/419 |
| 2011/0176179 A1* | 7/2011 | Judelson | 358/448 |
| 2012/0239635 A1* | 9/2012 | Murdock et al. | 707/705 |

* cited by examiner

Fig 17

Maintenance Items are broken down into 3 categories; Parts, Equipment Types, and Installed Equipment.

Parts are consumable items like paint, tile, and carpet. Items are loaded during construction and can be partially or wholly substituted later by changing the type (Equipment Type) or instance (Installed Equipment) detail. Parts can then be assigned to finish types (i.e. floor, ceiling, north wall) (Sheet 26).

Part Type View (Sheet 1-1, SM)

Monday, March 7, 2011

SYSTEM AND METHOD FOR MANAGING FACILITY CONTENT AND EQUIPMENT INFORMATION

CROSS-REFERENCE TO RELATED APPLICATIONS

The present application claims the benefit of U.S. Provisional Patent Application No. 61/331,472 filed on May 5, 2010 entitled "Facility Content System," which is hereby incorporated by reference.

BACKGROUND OF INVENTION

1. Field of Invention

This invention relates generally to facility management and, more particularly, to systems and methods for managing a facility's content, equipment and infrastructure.

2. Background Art

Buildings have become increasingly complex to maintain, particularly large modern buildings having multiple floors. These buildings feature a plurality of different building systems, including electrical systems, heating/cooling/ventilation systems; plumbing, security systems, communication/data systems, telephone systems, elevator systems and others. Many of these systems are inter-dependant, for example the heating and cooling systems are dependant on the electrical systems. Each of these complex systems must be maintained and managed according to various rules and regulations, and also according to best practices, in order for the smooth and efficient operation and maintenance of these systems and the overall building. However, detailed and current information regarding the building's infrastructure is necessary to accomplish successful maintenance and management of the building. Often the information available regarding the building infrastructure is not current and/or is not readily accessible in a user friendly manner and even if the information is available in some form or another, the amount of information is so large that it is not able to be managed easily in such a manner that is effective for managing and maintaining a building. Building management systems that are available often are not user friendly and do not have an easy mechanization for updating information such that it is current.

Automatic management of such building systems is clearly desirable over manual management and/or over handling paper drawings that are often out of date. The systems are sufficiently complex that it is difficult if not impossible for a maintenance engineer to fully visualize them and to manually handle a huge amount of complex data. Furthermore, often maintenance should be performed according to a particular schedule, in order to prevent malfunctions in one or more parts of the system.

Various software programs have been proposed in the art to overcome management and maintenance problems. For example, applications have been proposed that are able to assist in the maintenance and management of building systems, once the plans for these building systems have been manually input. One such system is described in PCT Application No. WO 06/004649, which describes software for management of building systems after the plans have been manually analyzed. However, these type of solutions clearly require manual analysis of the plans (blueprints) of the building and identification of objects therein, much of which is not easily accessed and inventoried once the building is complete, which can be disadvantageous in terms of the return on the investment of time and effort required. Manual analysis is time consuming and can also lead to human error. Automatic analysis methods in general could potentially have an advantage if such a product could be readily developed and standardized and made reproducible and effective regardless of the building design. However, even with an automated system, there will likely be errors or holes in the data due to the huge distinctions between different building structures. However, in this area, such an automated analysis method is not readily available and likely not practical.

There are some systems that provide geographical views and top level information about equipment such as information technology equipment, furniture and building space. However, many of these systems are an integrated system of sensors, transceivers and controllers for automatically controlling certain building systems and sensing various building metrics, for example temperature. Some systems have been proposed that allow for manipulation of drawings, reports, requests and different layer views with a navigation scheme, see U.S. Patent Application Publication 2006/0031455. However, even with systems of this nature, the level of detail for comprehensive maintenance down to the level needed for the original construction plans is not provided, nor is it considered. Further, significant manual input will likely be required.

It has been proposed that in some large installations, all HVAC components (sensors, counters, contacts, etc.) are connected via a DDC/PMS (Direct Digital Control/Programmable Management System) unit to a Building Automation System, and the Building Automation System can be connected to a Building Management System to form an integrated monitoring and control system. However, monitoring and controlling systems are only a small portion of the overall building management task, thus tools of this nature are not comprehensive in addressing the need.

A building's life cycle can include several phases. A pre-design phase can be when the project is initially conceived for a building, facility or product, and can include site analysis, project pro forma (the analysis of the financial feasibility and related design of the project), program development, and the like. During the design phase, the building components of the project are designed, which can be items that are necessary for the operation or maintenance of the building or are inherently permanent. The design phase includes schematic design and design development of the project. The documentation can include the detailed documentation of the design that is further refined down to the detailed drawing, which can include non-permanent fixtures and infrastructure. The documentation phase can include working drawings, specifications, and construction contracts, and the like. Typically, after the documentation phase is the pricing phase where the project is priced or bid. Typically, after the pricing phase the project is implemented. The implementation phase includes construction administration, construction, installation, assembly, change orders, field orders, mover's instructions, product warranties for facility management, occupancy, placed in service, use, and the like. The implementation phase is conducted based on a detailed set of drawings, including installation orders down to the smallest detail, and it is this level of detail that is ultimately needed for effective management and maintenance of the building. When the building is put into operation and use there must be a day to day operation, maintenance and emergency management of the facility. In order to effect repairs and modifications, certain details concerning the building need to be readily accessible; or, in order to properly respond to emergency situations involving the building, again certain details are also needed.

At some point in time the use of the building will diminish or even the building itself is abandoned. Abandonment may include a study to determine the feasibility of an alternate use that usually requires partial or even full demolition. When alternate uses are determined unprofitable (usually because of elevated cost and complexity associated with remodel construction), the result is a vacant building that is characteristically a social and health hazard having a negative influence on neighborhood cohesion and welfare. Demolition of the building may ultimately result; however, building methods generally do not lend themselves to being "de-constructed" into segregated parts which could be reused. Therefore, the demolition of buildings may result in destroying the integrity of the individual building components. Demolition of projects and their components become very low grade waste at best and, more often, become an environmental hazard requiring special landfill permits because, in its composite state, it produces off-gases and byproducts that are volatile and hazardous to the health safety and welfare of the public.

A more comprehensive building management system is needed that will address the above outlined problems, particularly those relating to the completeness of the data, accessibility, and user friendly interface.

BRIEF SUMMARY OF INVENTION

The invention is system and method for providing a detailed Facility Content System (FCS) that leverages a Building Information Model (BIM) created during the design and build phases of the process of construction to deliver Operations and Maintenance (O&M) content to building owners. The O&M content can have the level of detail required during the detailed design and build phases thereby providing sufficient information to the operator/owner for on-going operations and maintenance. The system will use extracted images from the BIM to drive the navigation of the system and provide data to the user not previously available in the current O&M deliverable or other facility management systems. Rooms and equipment will also be supplied with QR (Quick Response) codes which may be scanned with mobile devices to drive instant access to room and equipment information.

The present invention is a system and method that provides a unique building maintenance tool which leverages the information collected during the design and construction phase of the building lifecycle. User access to BIMs, Revit (or other similar building design software) schedules and other data sources within the unique construction process provide clients with a post occupancy view previously unobtainable. The solution provides for simple integration with external data sources through data file import or direct integration. The intent of the data integration model is to reduce costs of ongoing implementations providing a scalable model. Mobile access to information is a central component of customer appeal and will be a focal point of the design process. With the present invention, mobile users can use a mobile device to scan 2 dimensional barcodes or QR Codes or other type of georeferencing code including RFIDs and thereby use the mobile device as the primary navigation portal to room and equipment information and images. The present invention provides building management functionality by leveraging extracted building data of a database constructed from construction process data as a foundation, which includes detailed equipment specifications. The invention also includes tools to build on and update the foundational data to include maintenance schedules and history; work order management; part tracking on work order history data; build solution in a hosted model; and administration and support of multiple client implementations on a single application instance.

One embodiment of the present invention can be a facility content system network server communicably coupled to a customer client network comprising a content network server having executable content enterprise resource planning (ERP) systems and web services applications residing thereon and communicably coupled with a file server function, a database server function with associated computer readable storage medium and data structure, a legacy project construction management application server function with associated computer readable storage medium and an administrator computer work station operable to execute the ERP systems and web services applications to thereby pre-populate the database server function content with detailed design and construction data during the construction project. The invention can further comprise a customer client network web server communicably coupled via a local network to a customer computer work station having a computer executable browser based user interface application residing thereon and to a mobile computing device having a computer executable mobile browser based user interface application residing thereon, and where said customer client network web server is communicably coupled via a wide area network to said content network server and where said customer computer work station is operable to execute the build/maintenance and web services applications to thereby maintain content.

The invention can also include a facility content system network server communicably coupled to a customer client network comprising facility content system data associated with equipment, finish types, images and custom properties stored in a computer readable medium with an account centric data structure where the data is segregated by a building, an area within the building, and a room within the area, where the facility content system data is initially pre-populated using data generated by a legacy project construction application and design-build data inputs from a building integration model. A user interface client application can have a navigation schema adapted to access building objects, area objects grouped within said building objects, room objects grouped within said area objects, and equipment instances within said room objects, and where said user interface client application is operable when executed to access said objects and display images representative of content data within said objects.

A unique building maintenance tool is provide that leverages the information collected during the design and construction phase of the building lifecycle to provide a comprehensive detailed management tool without significant manual input. These and other advantageous features of the present invention will be in part apparent and in part pointed out herein below.

BRIEF DESCRIPTION OF THE DRAWINGS

For a better understanding of the present invention, reference may be made to the accompanying drawings in which:

FIG. 17 is an illustration of the equipment view;

FIG. 25 is an illustration of a maintenance item view;

FIG. 26 is an illustration of equipment types;

FIGS. 28 through 33 are illustrations of the administration functions;

Figure 1:
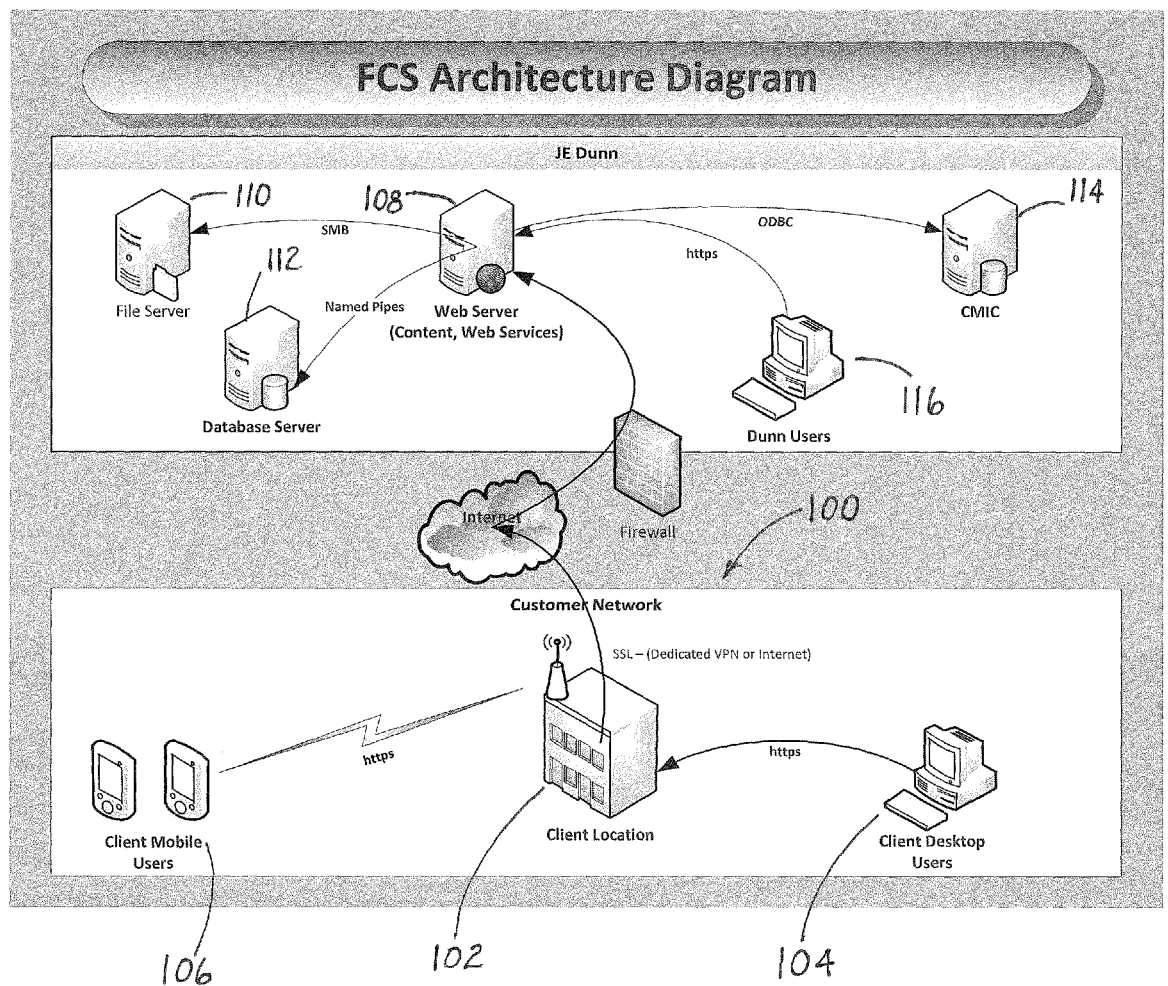
FIG. 1 is an illustration of the facility content system.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but, on the contrary, the intention is to cover all modifications, equivalents, and alternatives falling within the spirit and scope of the present invention as defined by the appended claims.

DETAILED DESCRIPTION OF INVENTION

According to the embodiment(s) of the present invention, various views are illustrated in FIG. 1-41 and like reference numerals are being used consistently throughout to refer to like and corresponding parts of the invention for all of the various views and figures of the drawing.

One embodiment of the present invention comprising a facility's content system and database teaches a novel system and method for managing a building.

The user interface (UI) of the present invention is a browser based application having a navigation scheme. There are various navigation levels for drilling down to specific data being accessed. The main page has various different navigation tabs that can be selected by the user thereby initiating a collection of data for presenting the data fields in a screen format as defined by the rules or schema of the tab selected. The home page for each building selected can serve as a starting point for navigating to specific information regarding the building.

A service request tab can also be provided whereby a user can initiate and submit a work order and view a work order history, update a work order, or cancel a work order. A maintenance tab can also be provided where the user enters into a work order management mode to dispatch resources, view the status of a work order and change the work order status, and view the related equipment. A reporting tab can also be provided where the user can initiate and access reports regarding work orders.

A building administration tab can also be provided where the user can access building maintenance, area maintenance, room maintenance, part maintenance, and equipment maintenance views. Room facility and room equipment can also be viewed by the user.

A system level administration function can also be provided where a user can have access to varying levels of administrative tools including account maintenance and new or revised content population. The level of access for a given user can vary depending on the security access level.

If a user navigates to the Building View, general information can be viewed including building address information, general building description information, project code correlating to the original build project, a building code, and top level images of the completed building. A user can log on, and based on the individual users' security access level, can view different levels of information regarding the building. The user can navigate to an Area View to access and view information including Large Key Plan Image, Listings of Defined Areas, and Listings of Rooms contained in a selected area. A user can select an area from list in order to view area key plan and room listing or make a selection of a room from the room list, which is linked to the Main Room View.

The user can also select an Equipment View, which allows the user to access notes relating to the unique codes that can exist for each piece of equipment that can be tied back to the Equipment View within the appropriate room. Within the Equipment View, the user can also access the Instance View which can be an aggregate of equipment type properties and equipment instance properties. Other more detailed information can be accessed and viewed in the Equipment View, including the name of the equipment, the equipment part number, warranty information, subcontractor contract information, vendor contact information, and service provider contact information. Links to specification sheets and to the equipment vendor's website can also be provided to the user.

The Main Room View can also be accessed from the Building View navigation tree. In the Main Room View, a user can view various images of the Key Plan of a floor or an area of floor. A Reference key to the location of room in building can be provided and can be linked to a larger image of the same view. The current room can be highlighted and embedded within the area image and enlarged key view images can be provided. An "Extended Room View" Image can also be provided where the surrounding areas around the room or area are shown. A description of the room can be provided and various Room Construction Codes and Facility Defined Room Codes. Links can be provided to photographs of interior of room (NESW); to within "Extended Room View" to adjacent rooms visible within view; to "Structural View Above"; to "Structural View Below"; to "Mechanical View"; to "Electrical View"; to "Facility Data"; and to a page displaying Items like Wall Paint Color 1&2, Ceiling type, Mechanical Access Requirements, square feet, cubic feet, flooring. Facility Data Types can be predefined. From the Main Room View, a user can navigate to the Structural View Above and Structural View Below, which includes an image of the structural view. The user can also navigate to the Mechanical View, which provides links to equipment information from defined hotspots and provides links to access the work order history and equipment data. The user can also navigate to the Electrical View where a room description is provided as well as the end facility room number and an image of a mechanical view. Links to an Equipment View for equipment defined within the electrical image is provided. Facility Data View is yet another option for the user, which provides a List of facility data elements defined for the room.

From the Building Homepage, the user can select Reporting, where the user can generate reports regarding submitted work orders and work order completed by week or date range. The user can also review reports on certain metrics such as percent Work Orders Completed On Time. The user can view a Room Contents report by room with a list of equipment, including subcontractor info, vendor info and service provider info. In addition, the user can view an Equipment Contact List, including List of Equipment, Subcontractor Info, Vendor Info, and Service Provider Info.

In addition to creating and tracking work orders, the system can have full functionality to create, read, update and delete details of the work order. There can be a Work Order ID assigned to each work order created. End users can display orders which they have created, whether active or inactive. Different views can be created and presented for the Requester and the Maintenance User. The work order can be tracked from its initial status while pending assignment all the way to completion. Maintenance personnel can have the ability to self assign tasks in work queue based on priority and responsibilities. Users can have more than one task assigned at a time. Work order status moves through a progression from being created, to Pending Assignment, to being Assigned (status changed when Maintenance User self-assigns), to completion, or to cancellation.

The user interface of the present invention also provides an Administration function where users create, read, update and delete information in a database. The information that can be operated includes User Maintenance information such as information related to properties or Role Maintenance. Account Maintenance can also be an administrative tool provided to the user where the user can create, read, update and delete client account information, building maintenance information and area maintenance information and room maintenance information including Room Project ID, Room Description, Room Number (Building Assigned), Navigation Code (QR Code), Area (From Defined Areas), Link to "Room Equipment Maintenance", Template Type and Facility Data. Some information may have restrictions on editing. The user can also create, read, update and delete information related to equipment maintenance including general notes relating to types of equipment in the building, warranty information, subcontractor contact information, vendor contact information, service contract information, maintenance schedule and specification sheets. The user can also perform a similar function at the Room Equipment Maintenance level where individual pieces of equipment are assigned to a room and links can be provided to the Equipment View navigation tree level. System Level Administrators can have access to Room Template Maintenance to define Room Templates to be used to drive which features will be available and in need of population for each room. The template serves as the template for room creation. This drives what is required to be populated. After room creation, these properties can be modified at the room level. A user can also create, read, update and delete Facility Data Maintenance information such as a list of available pieces of facility data including items such as paint color and carpet type which can be associated to rooms.

Other Administration functions can include automated task generation in the Work Order System where, upon completion of a previous scheduled task, a new one is created. Multiple schedules can exist for a single piece of equipment. The initial work order task can be generated and, if a part is modified, the existing task can be left as-is; and if a schedule is modified, then the existing task can be updated. When a work order task is deleted, all associated work order tasks can also be deleted. The system can also distinguish between automatically scheduled work orders and requested work orders. The following information can be included in the work order; Work Order ID; Requester; Room; Part (Optional); Description; Status; Priority (High, Med, Low); Estimated Effort; Actual Effort; Material Cost; Requested TS; Activate On TS; Requested Completion TS; Actual Completion TS; and Cancelled TS.

A user having an appropriate mobile device can scan QR codes for quick navigation using a web interface. A QR code can be a unique identifier, which can be logically linked to a room or specific piece of equipment. The unique identifier will be appended to the web request as a query string. The base URL will be stored locally within the properties in the administration/setup screen. If logged on, the user will be driven to "Main Room View" or "Equipment View" within "Main Room View" depending on which is relevant. If user is not logged on, the web interface will request a logon.

Prior to delivering the FCS to the facility owner, many forms of data must be populated from various sources. Though most system data can be administered through typical administration interfaces before and after system delivery, certain tools will need to be available during the initial data population process to facilitate bulk data loading. Examples of this are bulk data loading are: import template files and system exports, image content from design drawing and BIMs, integration to and from backend general contractor systems, hotspots within mechanical views linked to equipment definitions, and data submission portals.

Certain data sets used to perform the initial population of the system will be driven from systems or functions within the general contractor's organization during the original design and build phases. Examples of this are integration to and from backend general contractor systems, including image content from design drawing and BIMs, hotspots within mechanical views linked to equipment definitions and client account administration.

Finish Schedules can be generated and included. Generated Information can include Project Code (i.e. ERP Project Code), Room Code, Facility Data Type, and Facility Data Value. A room template can be populated. A CSV file can be exported from Revit and can be populated with room list and facility data. The CSV file can be uploaded via web interface. CSV data can be consumed generating room and facility system objects and Room Facility Data and Creation of place holders for Room View Child Views such as structure above. Key Plan files can be imported for each area by uploading and associating manually. Room View files can be imported including bulk import of Room View images and all room view types, including Room Home, Mechanical and Structural. The user can make room and view type associations based on naming convention.

Externally supplied tabular data and reference documents can be loaded into the system through "loader files" or bulk manual import. This data can be provided as spreadsheet documents defining data object within the system or groups of files to be imported and associated. This can decouple data population from any particular source until more automated integration or portal submission models can be established. Use of submission portal in lieu of import templates is an option.

Equipment types can be created and creation of room equipment associations can be achieved. Equipment schedules can be uploaded and associated with room codes and equipment codes. The information can be uploaded in a spreadsheet file as provided by the general contractor or the subcontractor. The spreadsheet file can be submitted from subcontractors or general contractor personnel in a spreadsheet file, which is different from being populated from a provided template. The spreadsheet template can be built with validation derived from the finish schedules from Revit. This can limit entry of room codes to those specified by the drawings provided. The spreadsheet file can be uploaded via web interface. CSV data can be consumed generating equipment type and equipment instance system objects. As part of the uploading process, Equipment Types and Room Equipment associations can be created. Equipment specification sheets can also be uploaded and associated to the equipment. Multiple spec sheets can be tied to a piece of equipment associated by equipment type.

Image definition and manipulation including Image region cropping and region highlighting can be managed in an external system. Images can be tagged and can be uploaded to the system and associated to Room View. Hotspots can be defined within the Room View images which can link to the Equipment View for that particular piece of equipment. These hotspots can exist independently of the underlying image so images can be updated without recreating links Some of the Functional Requirements of the image can be selection of Room View to be processed and displayed in the user interface Room View; Display existing hotspots associated to image; Create, Update and Delete hotspots. Each hot spot will be linked to an instance of equipment that exists for the room, and each hotspot will support display text and select borders.

Figure 2:
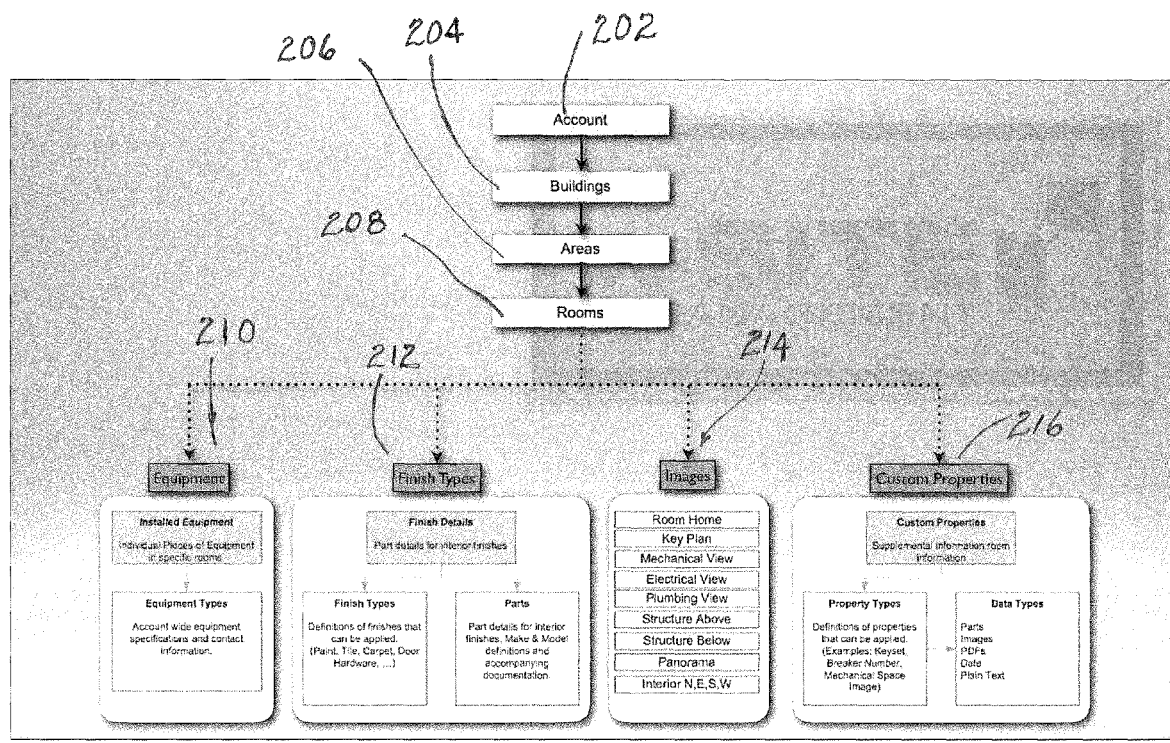
FIG. 2 is an illustration of a top level system organizational diagram.

The system and method of the present invention can be implemented by application software residing on the server side. There will also be a mobile device application with barcode reading capability. An SQL server can be the main data repository for all self-contained tabular, image, document and annotation data required for the system. Refer to FIG. 2 for a possible Application Layer and Data Layer. As discussed above, import files will be used to populate data in bulk from various sources. Many of these processes can be automated. Two general types of import files that can be utilised are spreadsheet files (used to import tabular format data and can be able to be processed as CSV data) content files. Content files can be uploaded in bulk and associated to the intended resources based on a naming convention and manual review process. Overlaps between data load of FCS and information currently stored in an ERP (or other financial and project construction management software) can be eliminated. A data repository model can be utilized for data store access. Files can be stored in the data store as binary blobs. File attributes (mime type, date modified, etc.) can be stored in an associated table. If a database bottleneck occurs, the files can be stored on the server's local file system and content can be replaced with file location string pointers. Data update and removal can be controlled at the application layer.

A mobile device browser file (MDBF) is maintained as a collection of the known browser identification strings passed in the header of an HTML request. The application can include a mobile view engine that inherits from the "default" web forms view engine. At run-time, it can search the HttpContext.Request for the calling browser (using the MDBF above). If a mobile browser is found, a mobile version of the view can be processed and sent to the client. The mobile views can exist in a pre-defined folder structure convention. The can be context driven partial views for items such as Room Properties and Equipment Properties that have associated "data types" such as "String" or "Image" or "PDF." The application can use partial views for the entry and display of content.

Controller actions (or GET/POST action pair) can be associated with a specific View Model with the naming convention "{Controller} {Action} View Model". The View Model can contain all the information needed for the views returned by that action. There can be several data objects that are members of a 1-M parent-child relationship. Screens for such parent objects can be handled using the following methodology: there can be one "Add New Child" JavaScript link and one "Remove Child" link per child object. The "Add" link can call a Render Action method linked to the Create method of the appropriate controller. The "Remove" link can call the jQuery remove( ) method to remove the child from the DOM. The form submit input button can call a JavaScript Renumber( ) method via the "onclick" attribute. The Renumber( ) method will renumber the N children object from 0 to N-1. During the POST event, the default model binder can automatically instantiate N new children objects and "smartly" assign their properties from matching POST parameters with the same name. The collection of POSTed children can be matched against the set of any existing children for the parent object. New POSTed children can be added to the parent, missing POSTed children can be deleted from the parent, and matching/existing POSTed children will be updated.

Users can be associated to the Building objects to which they have access. These associations can be maintained via User Administration screens. On those screens, Buildings can be grouped by Account. A User's Role is defined as a collection of Permissions. Permissions can be the lowest functional unit of security. There can be an association between Permissions and MVC (Controller, Action) pairs. By default, if any user requests an Action from a Controller for which there is no associated Permission, then that Action can be denied to the user (known as "white-listing").

The system can be Account-centric in that the account unit can be the focal point of client management. There can be one Account per client. Accounts can have an association with a particular Company. Building can be the organizational units used to group Areas. There can be more than one Building associated with each Account, and there can be one Building per Address. Buildings can contain Custom Properties such as external building images, PDFs, etc. Area objects represent functional sub-sections of a building. They can represent floors of the building or floor sub-sections ("East Wing", etc.) in the case of large floors. Areas can contain one or more Rooms. Areas can also have Custom Properties. Room objects can represent the smallest level of O&M fidelity above actual pieces of equipment. Rooms can also contain Custom Properties such as "Paint Color", "Number of Light Fixtures", etc. Special Rooms can be marked as "templates". These Rooms can contain a set of common data elements from which derived Rooms can copy initialized data. For example, a "Conference Room" template may be declared from which the Room "Executive Conference Room" or Room "Small Conference Room" may be instantiated. A Room can be created from scratch, copied from a Room template, or copied from another Room. These can be "deep copies", and, although they will maintain a link to the parent/source Room, they will be independently modifiable entities with no cascading updates to other Rooms.

Equipment object instances can be associated with a Room. Equipment can have Custom Properties. Equipment can also have a quantity value greater than 1 (though, this is only a field/property value, and does not represent multiple data instances). Similar to Room templates, Equipment templates can be intended for the user to create an Equipment instance containing common data for one or more derived Equipments. Equipment can be created from scratch, copied from an Equipment template, or copied from another Equipment instance.

A Custom Property can be a mechanism to allow users to add custom data items to Buildings, Rooms, Equipments, or other supported objects. A Custom Property can be comprised of a value and a Custom Property Type. A Custom Property Type can comprise a Name, Description, a class to which the property applies (Building, Room, etc.), and a Custom Property Type Data Type. The Custom Property Type Data Type can determine the data entry and display method for Custom Properties. It includes such data types as: String, Number, Image File, PDF, and DateTime. Equipment can have links to Vendors, Service Providers, and Subcontractors. Work Orders support a way to initiate, assign, and track maintenance actions associated with Equipment. Work Orders can also be associated to Users via the Requested By and Processed By navigation properties. All user-submitted files can be stored as binary blobs in the data store. Each file record can use File Properties to store file name, mime-type, etc. File Properties are (Name, Value) pairs to store File metadata. Image annotations can be stored in the same file properties object as other file properties.

For the mobile application, the home screen can consist of two large icons in the middle of the Portal Window. On the top or left will be a large version of the "Home" icon. On the bottom or right can be a large version of the "Scan" icon from the menu strip. The icons can navigate to the same place as their menu strip counterparts. The application can open to a start page with two large icons. The screen can consist of a real-time display from the photo-capturing device. There can be two buttons (either touch-sensitive areas on the screen or physical buttons elsewhere). One button can activate the photo-capture/QR scan. The other button can take the user to the application settings.

A live camera view will be visible on the screen during barcode capture. The scan engine can be enabled for all available barcode symbologies. Upon successfully scan of a barcode the browser can be directed to the URL defined in settings property and append the decoded value as a query string. Request the setup of administrative password on first entry. Require password setup before entering settings page. After initial setup of password, password is required for entry into administrative settings. Settings will control account information and target URL for app controlled web page navigation. Settings include such things as Account Number; System URL; Home URL Segment; Work Order URL Segment; Scan URL Segment; and Admin password (password chars).

The details of the invention and various embodiments can be better understood by referring to the figures of the drawing. Referring to FIG. 1, a top level block diagram of the facility content system architecture is shown. The diagram shows a customer network 100 located at the facility being managed. The facility being managed can be denoted as the client location 102 where the customer network is located. The customer network 100 can comprise a network of client desktop users 104 and client mobile users 106. The client desktop 104 can be equipped with a user interface and browser application that communicates across a network via an HTTP protocol interface. The client mobile users 106 can include mobile web browsing applications for communicating via the network. The customer network can be interconnected with a remotely located web server via a dedicated VPN or internet connection. The remotely located web server can be hosted remotely. The web server 108 can provide content and web services applications. The web server 108 can be networked with other servers such as the file server 110 and the database server 112 and other legacy servers such as the ERP server 114. The web server can also be communicably linked with various different work stations where administrative users can interface with the various servers.

Referring to FIG. 2, an illustration of a top lever system organizational diagram is shown. As noted above the system can be considered account centric in that the database structure as well as the navigational flow is centered on the client account. Within a client account 202 there can be multiple buildings 204 for which data is associated. Within each building construct there can be multiple areas 206 for which data is associated. And within an area 206 there can be multiple rooms 208 for which data is associated. Each room 208 can have various different data constructs associated thereto, including equipment installed in the room, where the equipment installed can be associated to a general equipment type. Each room 208 can also have finish types 212 associated thereto. The finished types can include data associated with finish details or part details for interior finishes. Each finish detail can be associated with a finish type as well as a part detail such as make and model. Also each room can have various images 214 associated thereto. The images can include room home images, key plan images, mechanical views, electrical views, etc. Each room can also have custom properties 216 associated thereto which can include supplemental information regarding the room including property types and data types.

Figure 3:
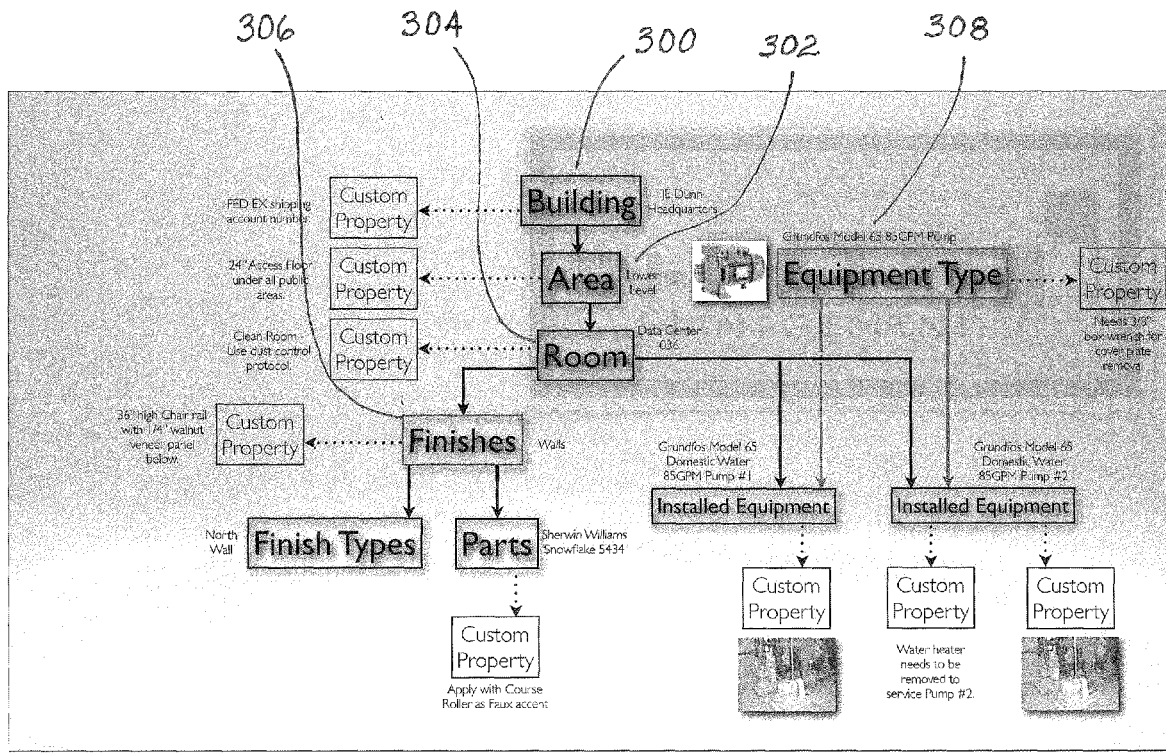
FIG. 3 is illustration of a particular building object.

Referring to FIG. 3, a further illustration relating to FIG. 2 is shown. The building is reflected as a specific headquarters building 300 having associated thereto a specific custom property such as a FedEx shipping account number. A specific area of the building is identified as the lower level 302, again having a custom property associated thereto such as a twenty-four inch access floor under all public areas. The room identified is specifically identified at the data center 304 which also has a custom property associated thereto (in this case a clean room using dust control protocol). The finish identified for the room is a wall 306 which has a custom property associated thereto, which in this case is a thirty-six inch high chair rail. The finish can have a finish type, which in this case is a North wall, and the parts for the finish in this case is a Sherwin Williams Snow Flake color. A custom property associated with the paint or part is a custom property which designates application with a course roller or faux finish accent. The equipment type specifically identified is a pump 308 and a specific model number is identified for the installed equipment.

Figure 4:
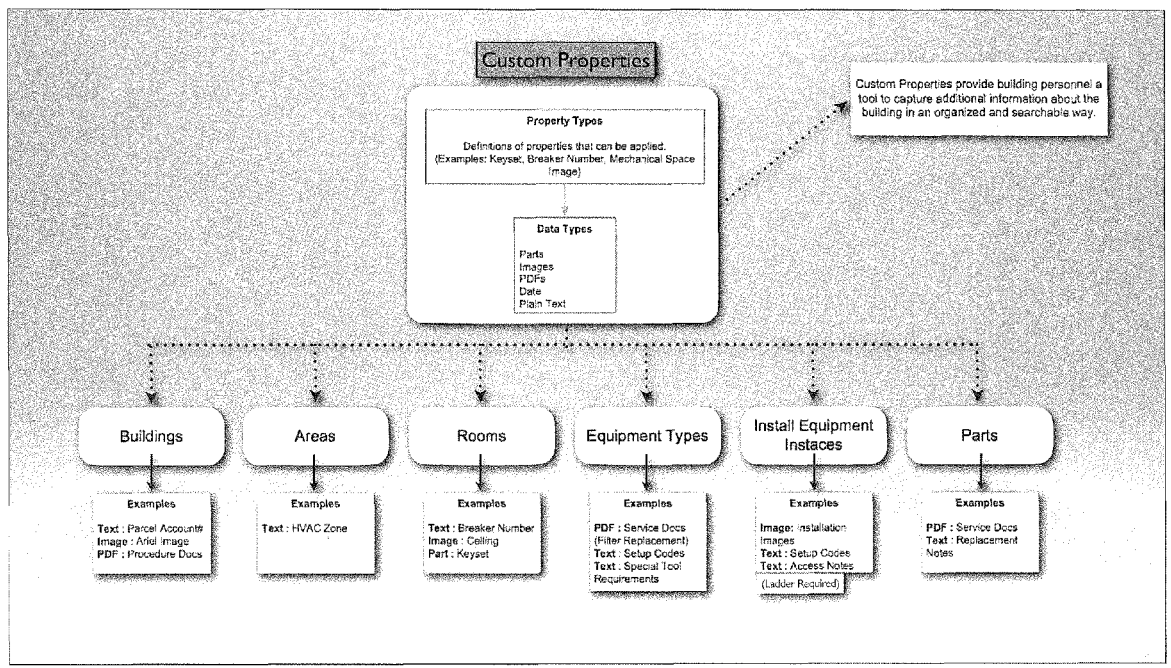
FIG. 4 is an illustration of custom properties.

Referring to FIG. 4, a further illustration is provided as to how custom properties can be utilised to provide building personnel a tool to capture additional information about the building in an organized and searchable fashion. The custom properties can include property types or data types such as parts, images, PDFs, dates, and plain text. Custom properties can be associated with each of the main sub categories including buildings, areas, rooms, equipment types, installed equipment, and parts.

Figure 5:
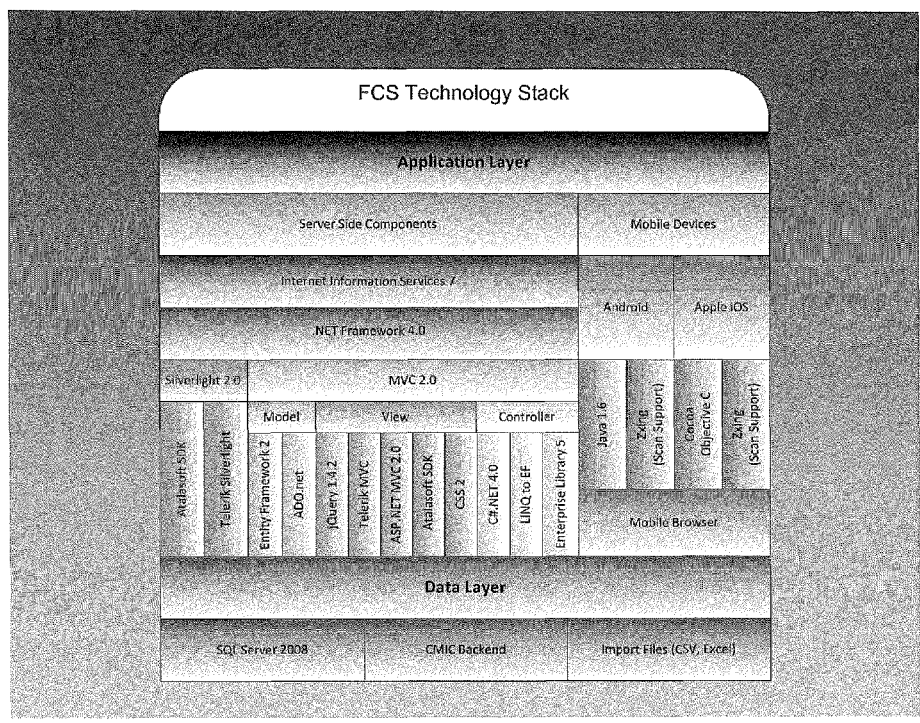
FIG. 5 is an illustration of the facility content system technology stack.

Referring to FIG. 5, the facility content system technology stack is shown having an application layer and a data layer. The application layer can include service side components as shown and mobile device components as shown. The data layer can include an SQL server database, various legacy databases including the ERP database as shown and various import files.

Figure 6:
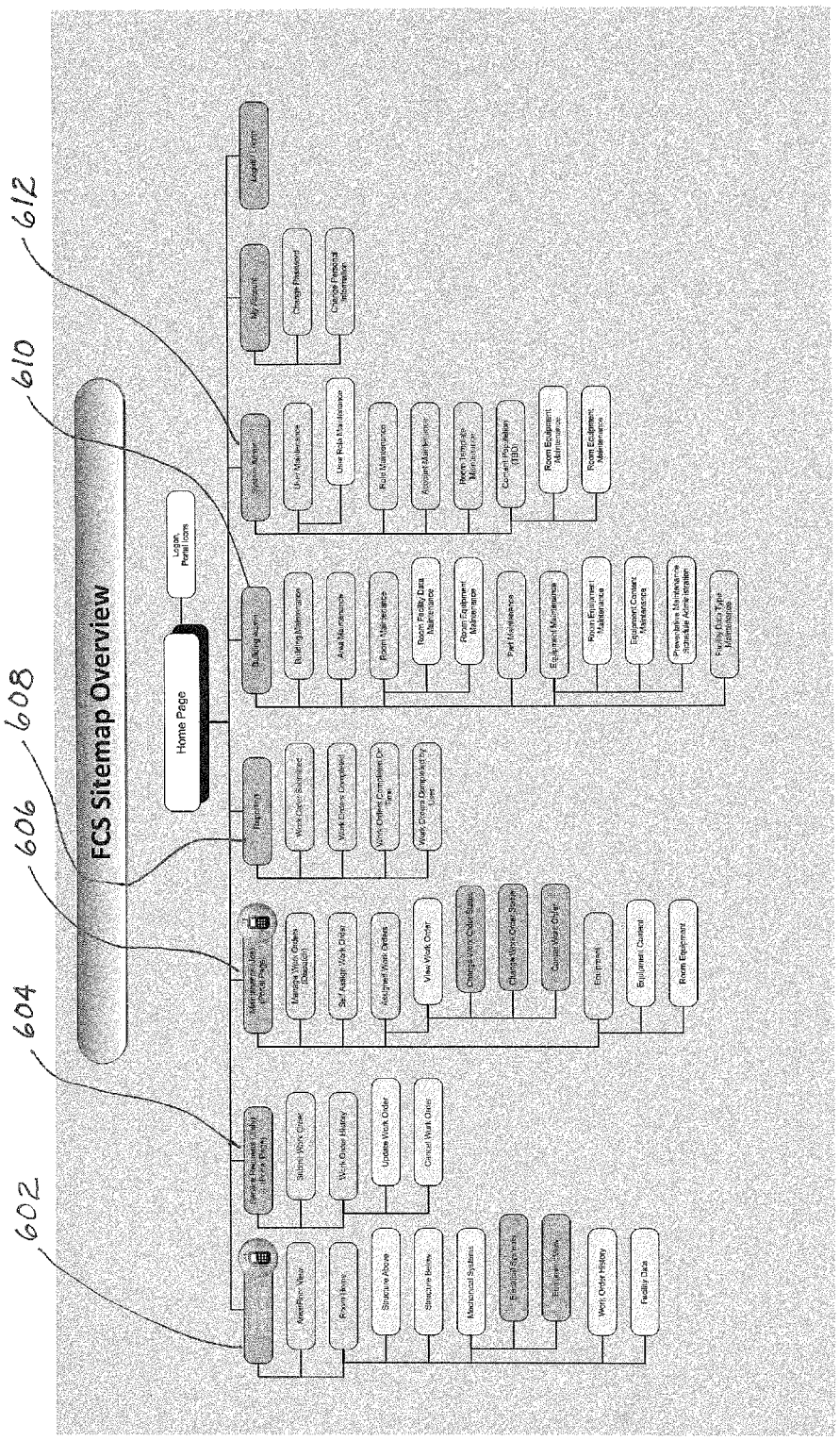
FIG. 6 is an illustration of the facility content system sitemap overview.

Referring to FIG. 6, a facility content system site map overview is shown. This figure provides an illustration of the site map for the user interface which shows the navigational tree structure for the various different pages of the site map. The home page is the top level page shown on the site map from which a user can navigate to a building view 602 a service request page 604, a maintenance page 606, a reporting page 608, a building administrative page 610, a system administrative page 612, and various other pages as shown. From each main sub page a user can navigate to various other pages and various functions as shown by the site map.

Figure 7A:
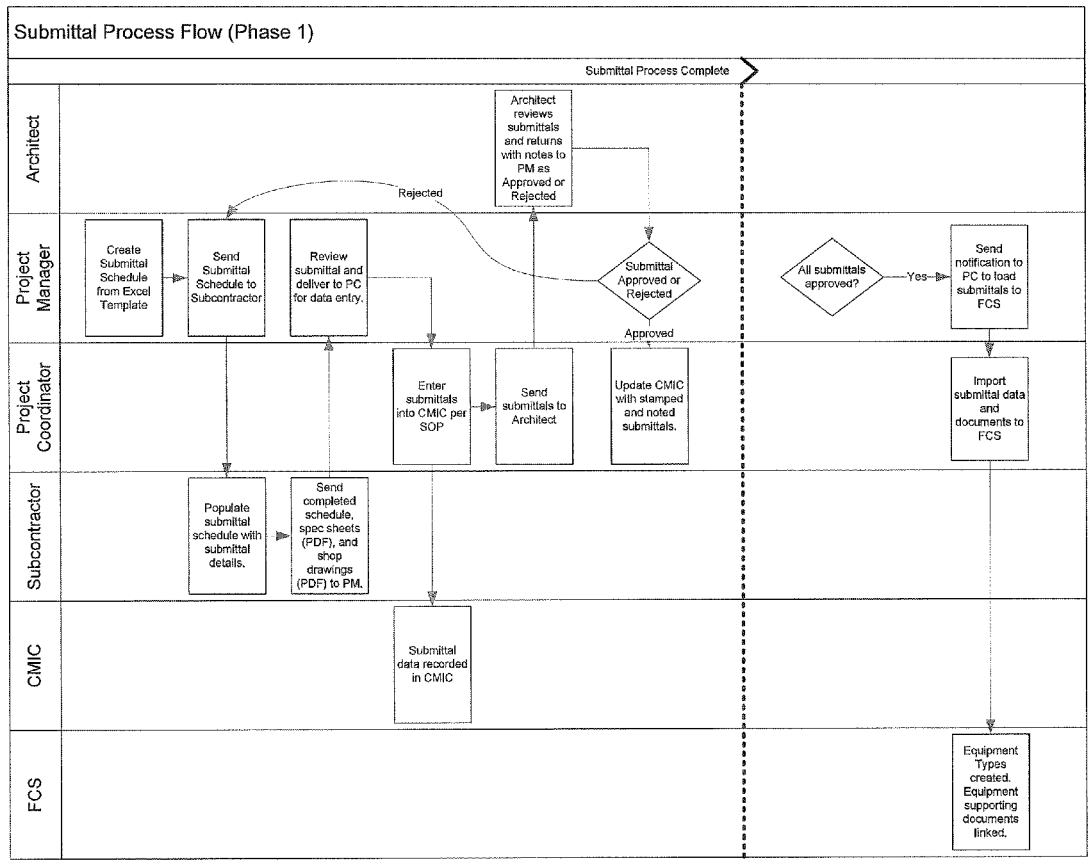
FIGS. 7A, 7B and 7C are illustrations of a process flow for submittal of data for initial population of the database.
Figure 7B:
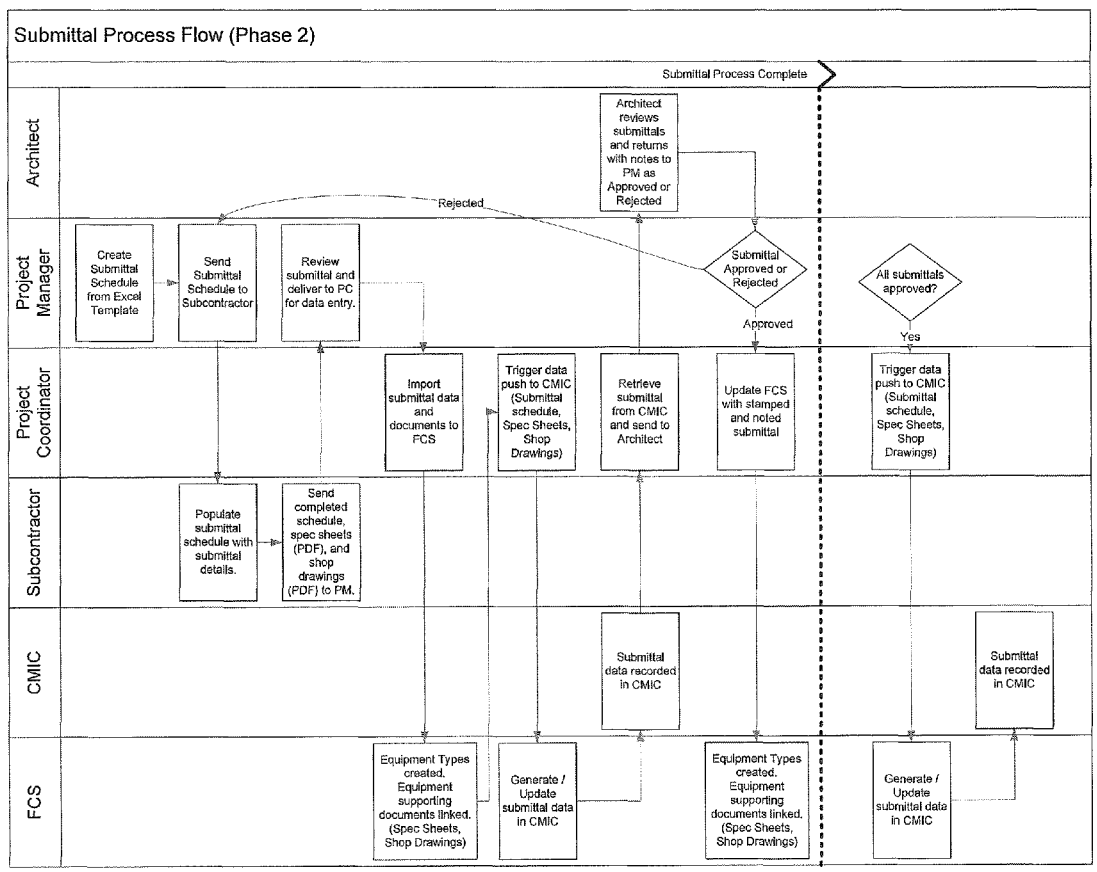
Figure 7C:
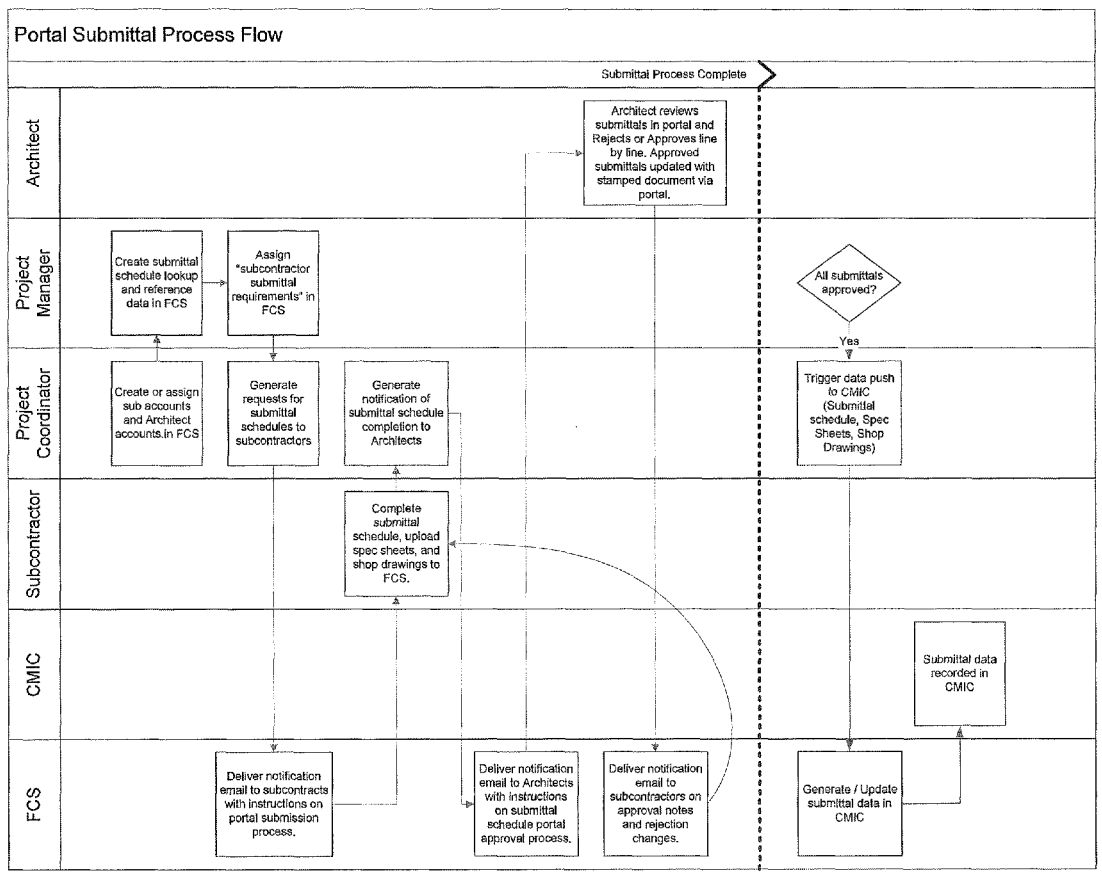

Referring to FIGS. 7a, 7b and 7c, a process flow for submittal of data for initial population of the database is shown. Various inputs from the architect, project manager, project coordinator, subcontractor, and legacy databases are shown flowing into the facility content system database. This initial process flow can be accomplished during the initial construction phase of the facility or building. This process creates a baseline database construct with the detailed design level information utilised during the construction phase of the project. The facility content system allows this information to be modified during the construction phase of the project and upon its completion. Therefore, when the facility content system is delivered to the end user for building management the database is pre-populated and ready for any further modifications to the data as daily operation of the building continues.

In one embodiment of the present invention, FCS can provide a web based "portal" interface to various users, such as project managers and subcontractors, in order for them to supply the details of the various data submittals. This portal can be used in lieu of the various legacy ERP systems, like the ERP, for submittal and entry of data. This embodiment can provide a single point of entry user interface for uniform submittal of data. Data collected in the portal can be pushed or pulled to other systems as required such as to the FCS database server. The total amount of information required by the project managers and subcontractors should not be significantly increased; however, the submittals can be standardized and organized in a more usable format. The "portal" can capture original submittal tabular data as well as the product cut sheet or information sheet. Once this data is collected, the portal can notify the approver of submittals that the submittals are ready for review. The reviewer can access the same portal and be provided with basic mark up tools. Once the data has been approved it can be logged into the facility content system. Rejected submittals will start the process over until approved.

Figure 8:
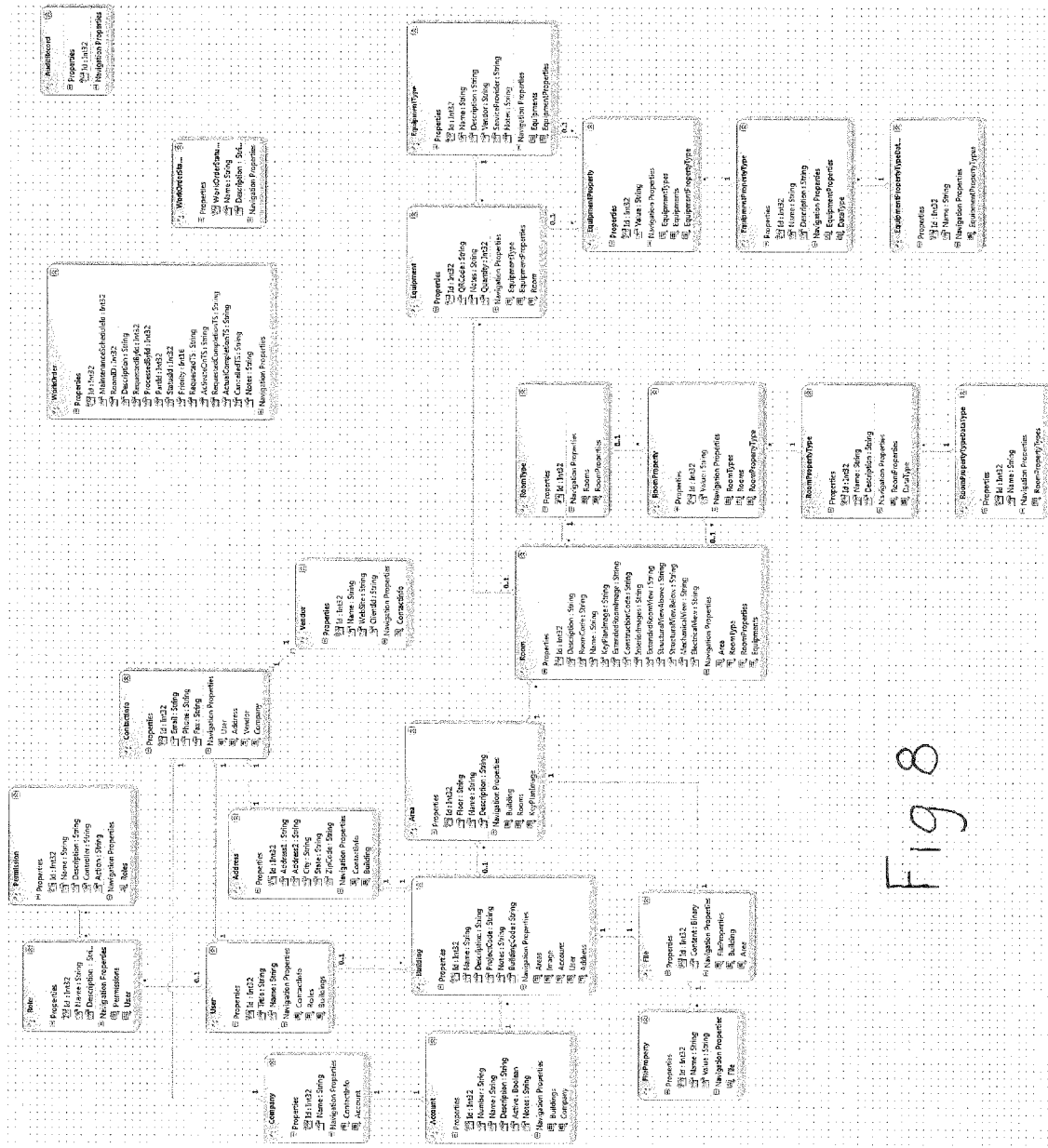
FIG. 8 is an illustration of the basic database construct with the various data fields and data types.
Figure 9A:
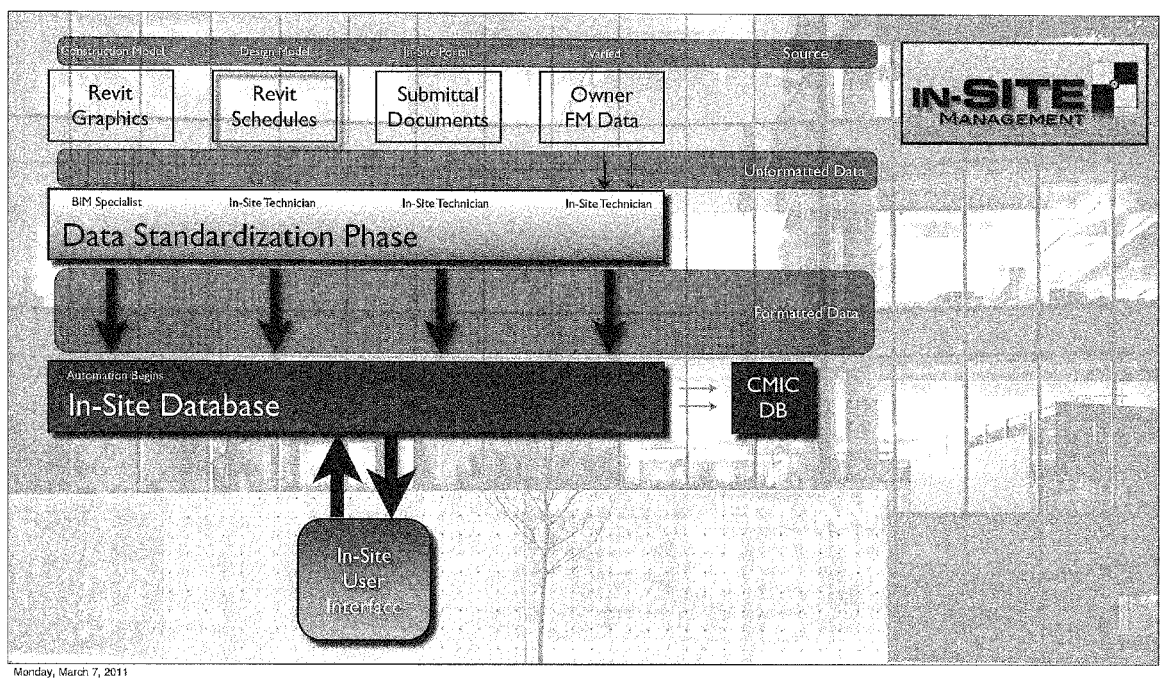
FIGS. 9A thru 9F are an illustration of the data standardization phase.
Figure 9B:
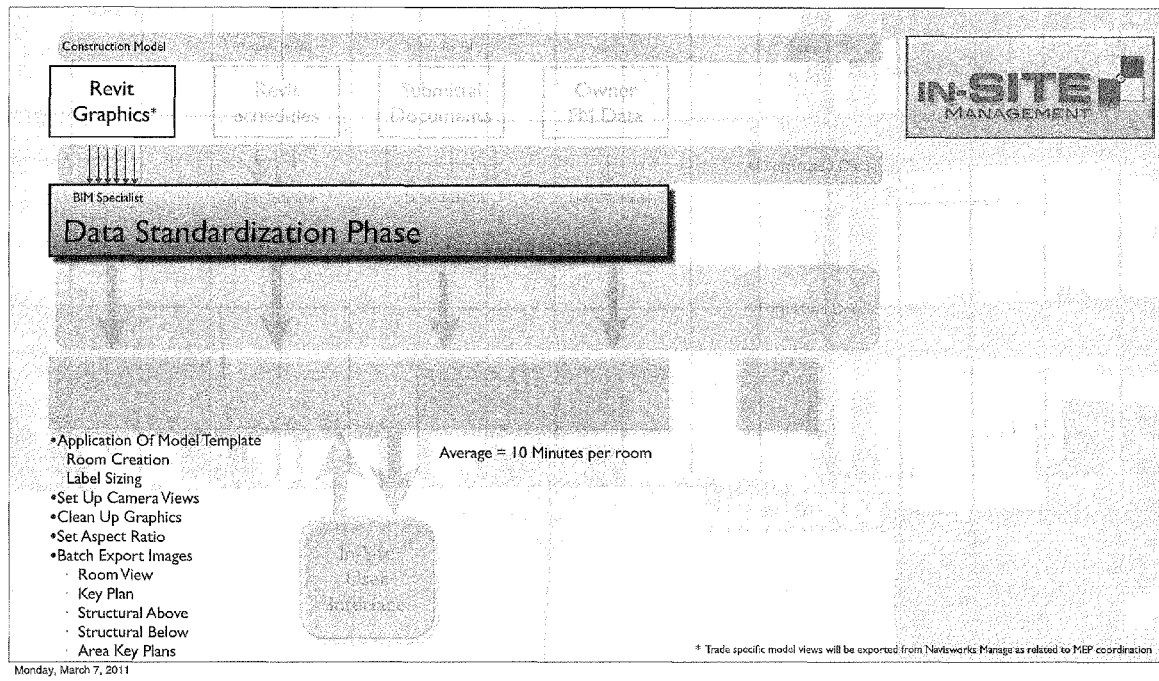
Figure 9C:
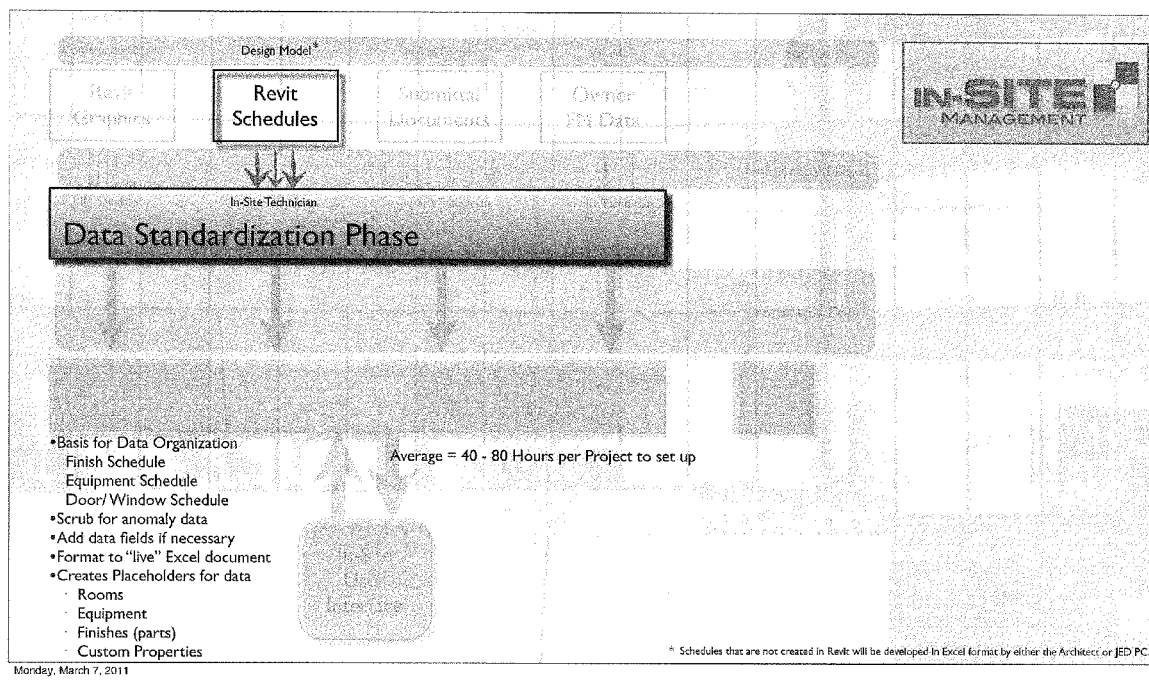
Figure 9D:
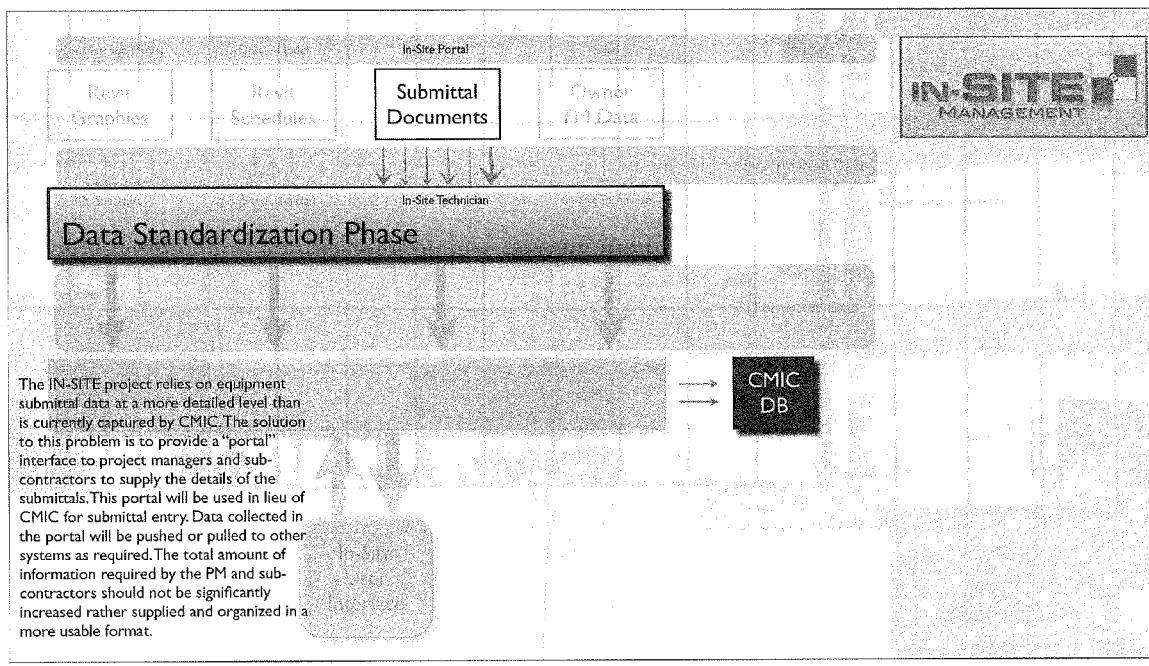
Figure 9E:
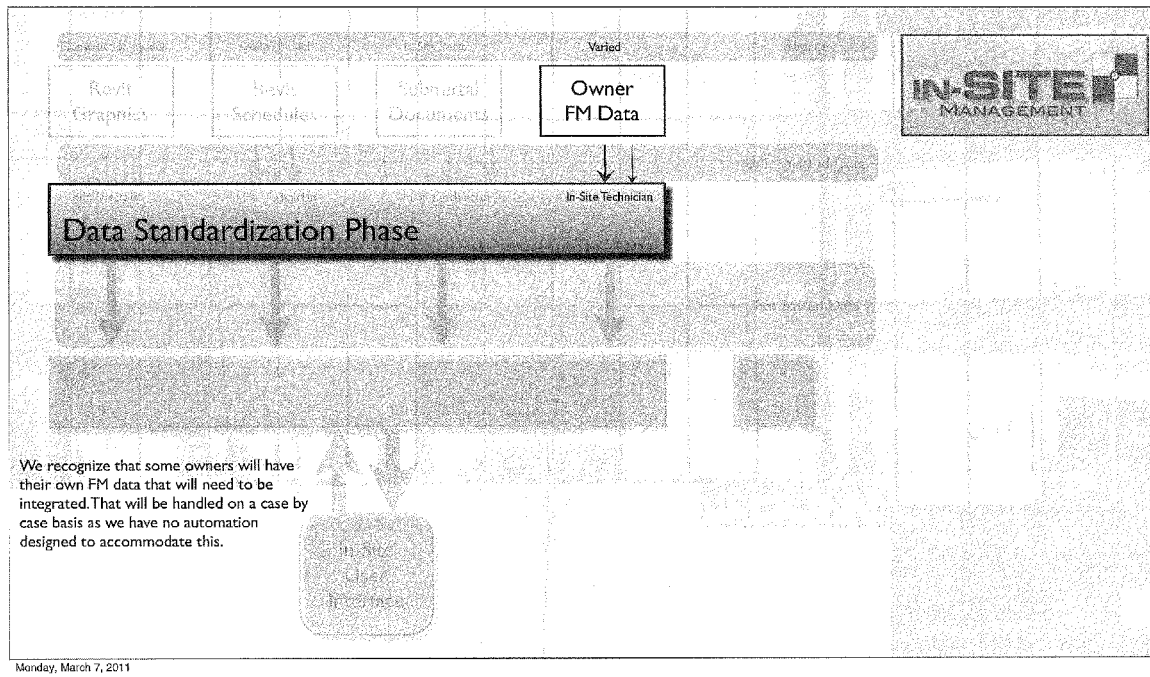
Figure 9F:
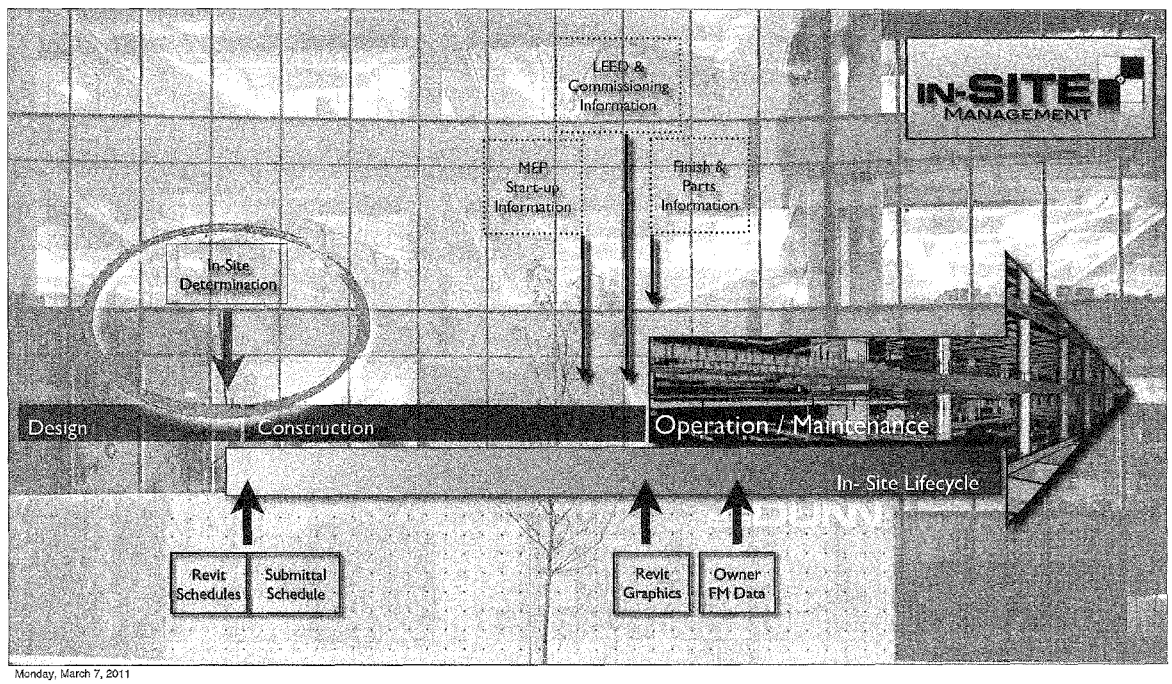

FIG. 8 is an illustration of the basic database construct with the various data fields and data types. FIGS. 9a through 9f are an illustration of the data standardization phase where the unformatted data from various different sources goes through a data standardization phase process where the data is formatted for upload.

During the initial data import process, a reference code can be generated for each piece of equipment of for each room. These navigation codes can be created in jpeg format and emailed to product suppliers. Each piece of product that goes to the site can be tagged with this navigation code that can communicate the products location or any additional instructions that need to be conveyed to the installer. All of this is possible by associating the ID code with the navigation code early in the construction process allowing the code to be used throughout manufacturing, shipping, installation, punchlist, project closeout and, finally, facility management phases.

Figure 10:
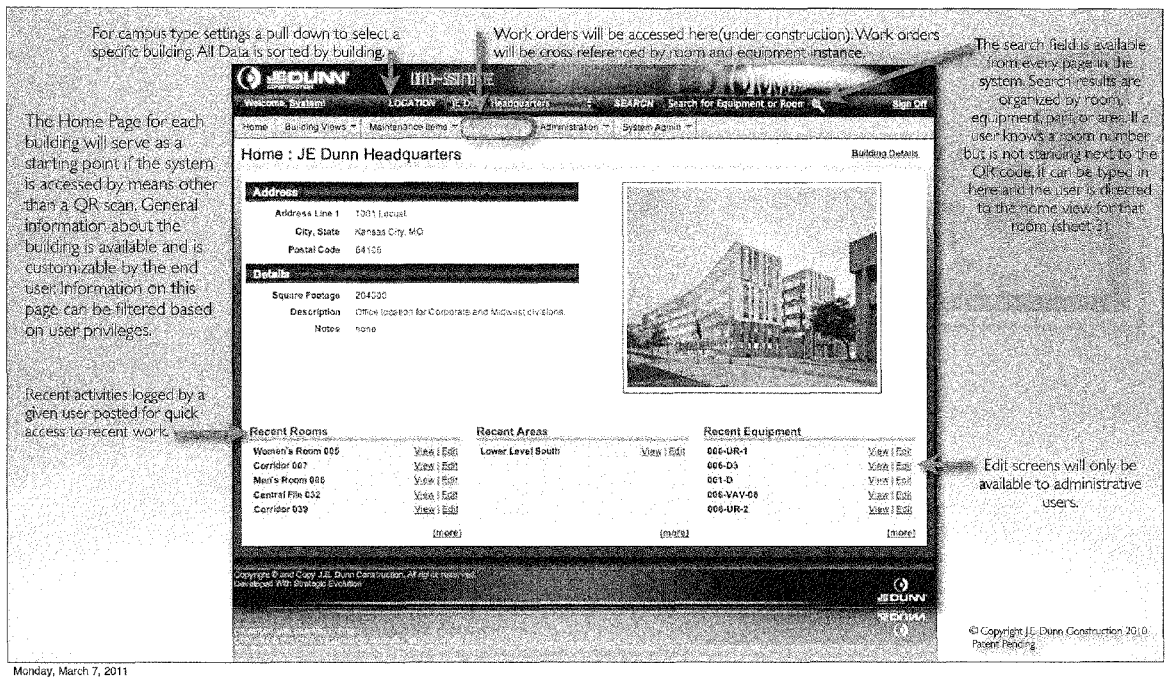
FIG. 10 is an illustration of a home page view for a given building.

FIG. 10 is an illustration of a home page view for a given building which can serve as a starting point for a user accessing the system. General information about the building can be made available on the home page for viewing by the user. Again the system is account centric therefore, from this home page view, a user could navigate to a different building or a location under the same account. Further, from this view a user can search based on room equipment part or area as sub categories under the building currently selected. This view can also provide the user with information relating to the most recent searches or views for which the user has accessed for quick navigation back to that location. From this home page the user can navigate to various building views, maintenance items, work orders, administration functions, and various system administrative functions if they are accessible to a given user.

Figure 11:
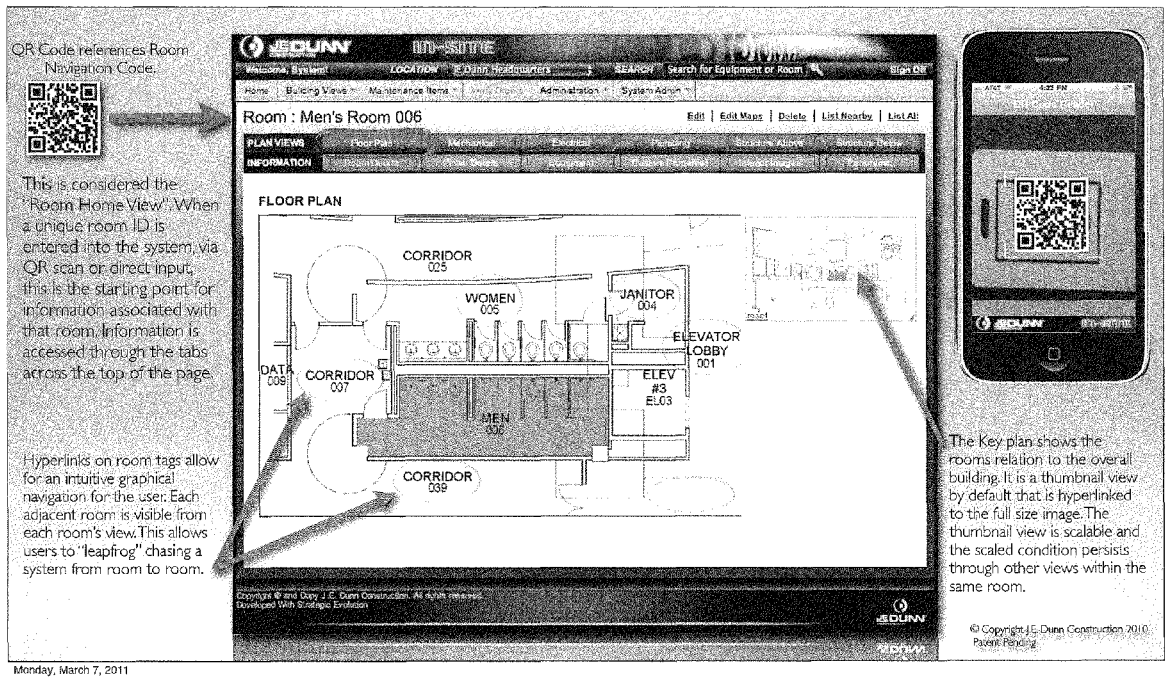
FIG. 11 is an illustration of a room home view.

FIG. 11 is an illustration of a room home view which has been located by a unique room ID entered by the user via a QR scan or direct input. By identifying a unique room ID the user can bypass an area view and navigate directly to a room home view as shown. Contained within the room view can be hyperlinks that allow the user to navigate to adjacent room views without having to navigate backwards. The key plan can also be shown in this view which provides the user with the relationship of the room to the overall building. This thumbnail view can be hyperlinked to a full size image and can be further scalable. This particular illustration or view within the room home view is the floor plan illustration.

Figure 12:
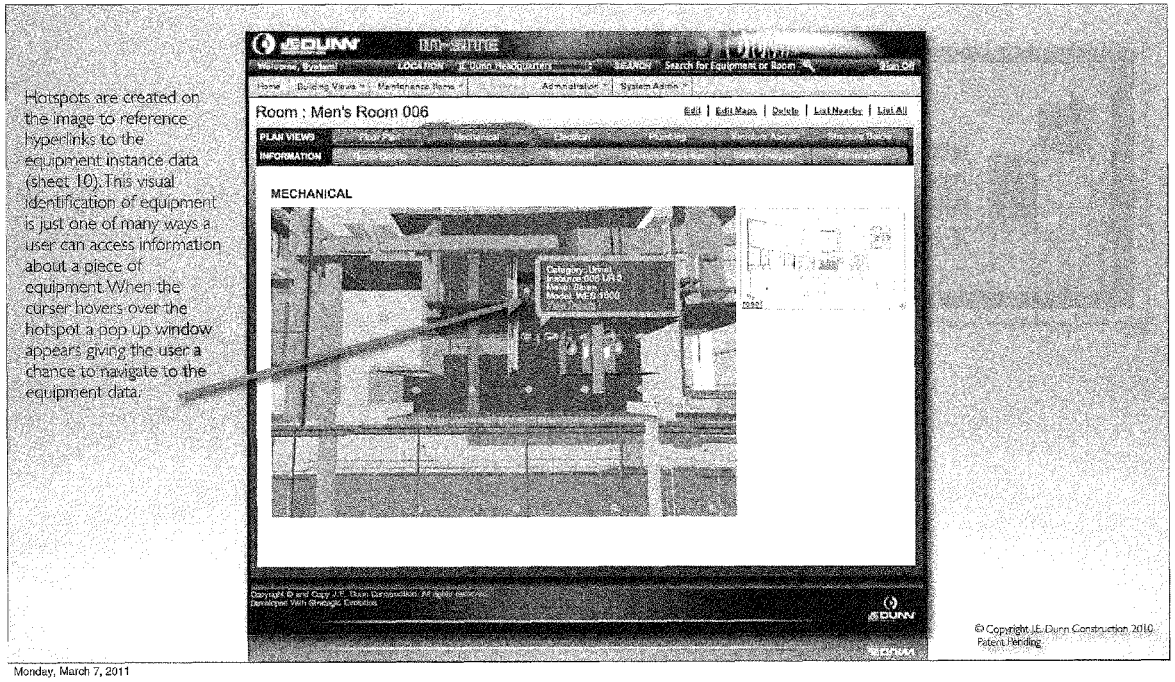
FIG. 12 is an illustration of the mechanical view.
Figure 13:
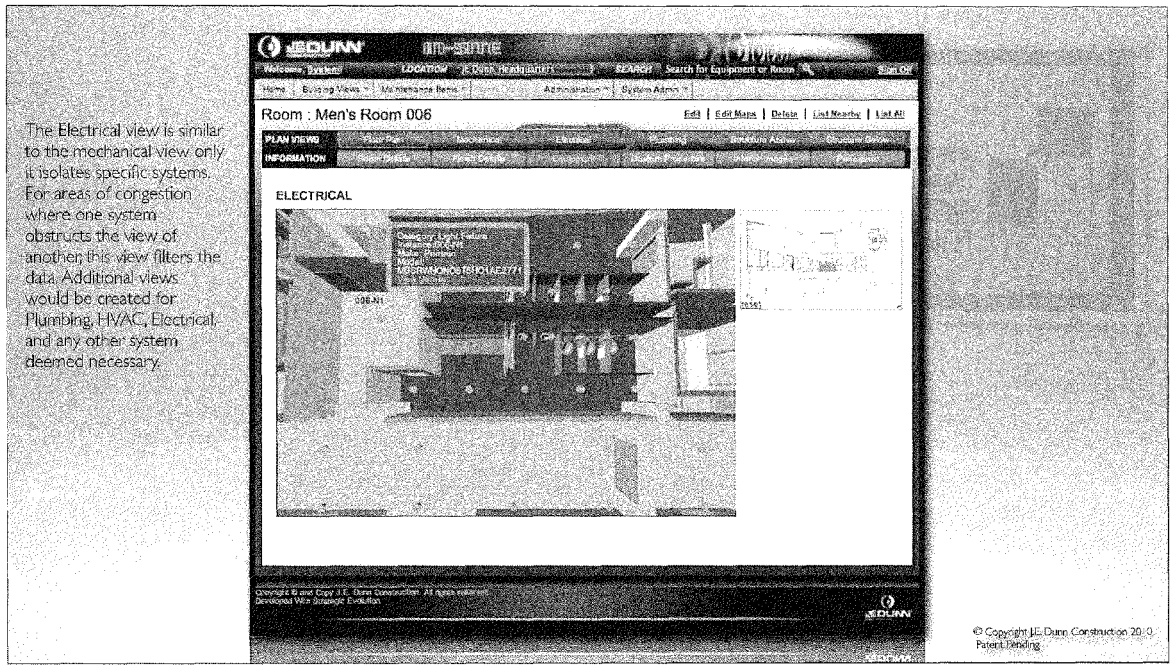
FIG. 13 is an illustration of the electrical view.
Figure 14:
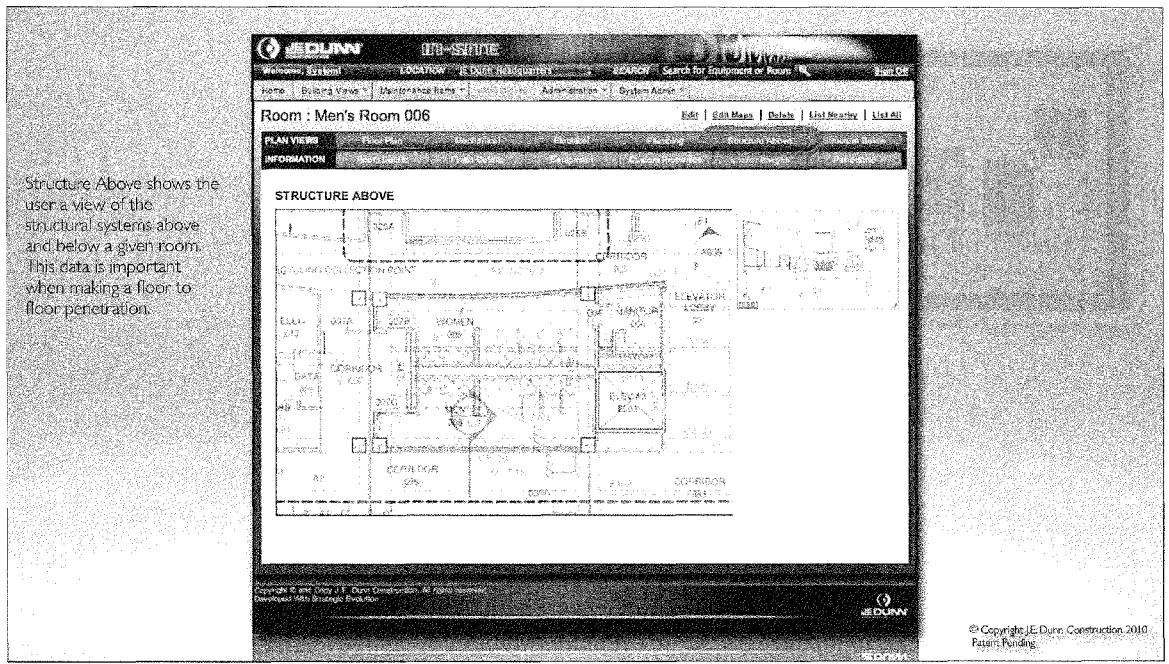
FIG. 14 is an illustration of the structure above view.
Figure 15:
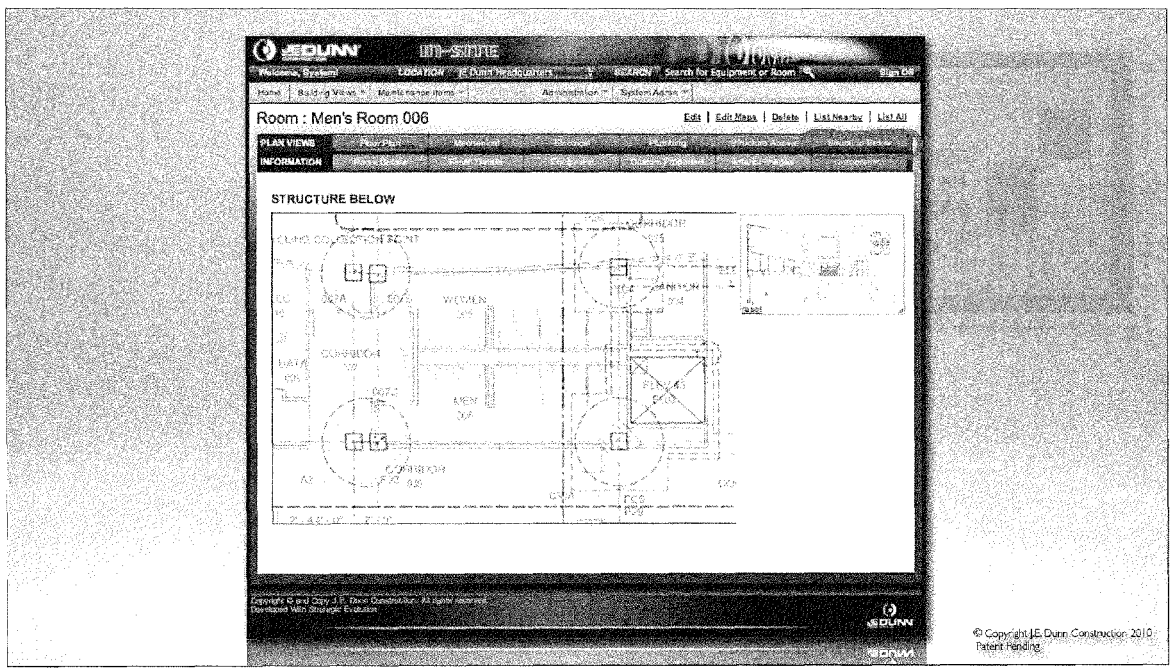
FIG. 15 is an illustration of the structure below view.
Figure 16:
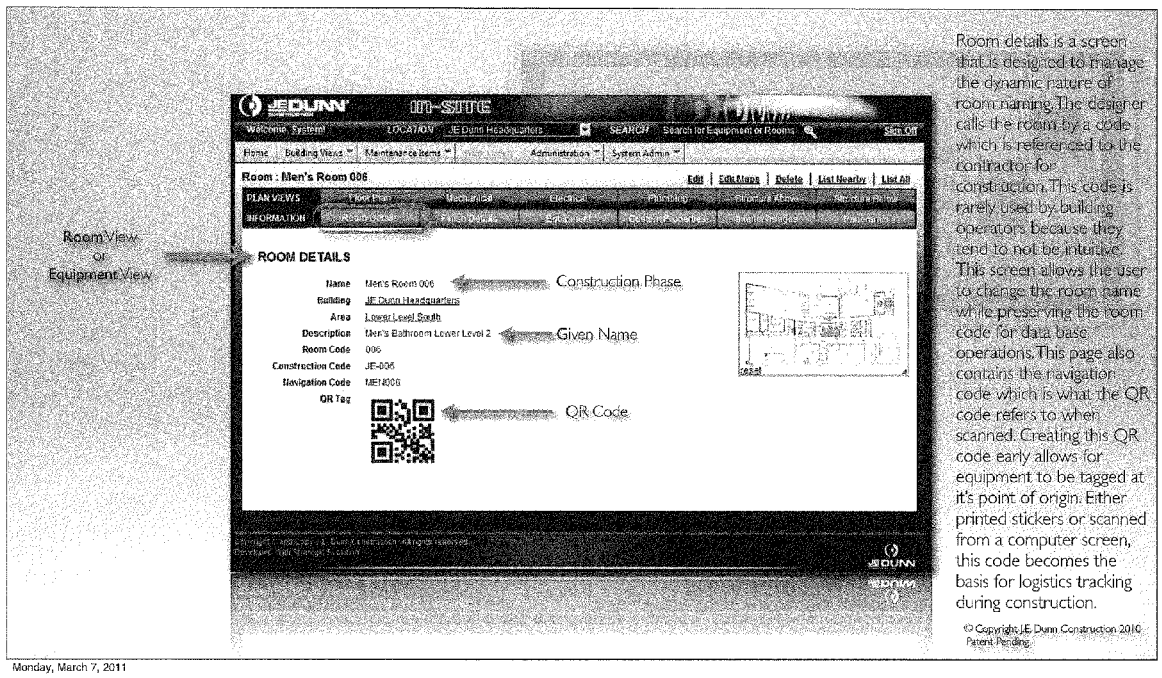
FIG. 16 is an illustration of the room details.

FIG. 12 is an illustration of the mechanical view. The mechanical view as shown in FIG. 12 can have various different hot spots that are created having hyper-links to certain equipment shown in the view. The user can navigate to the equipment data by selecting the hyper-link Similar to the mechanical view shown in FIG. 12, FIGS. 13, 14, and 15 illustrate the electrical plumbing and structure above view respectively. FIG. 16 illustrates the room details.

Figure 17:
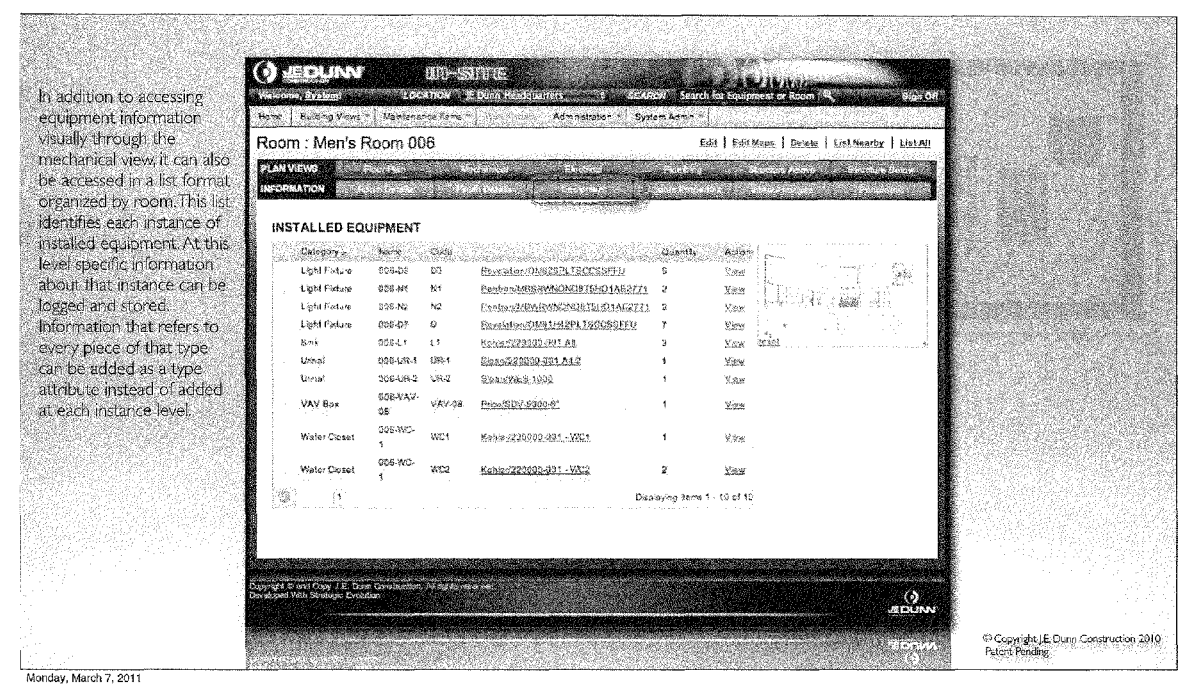
Figure 18:
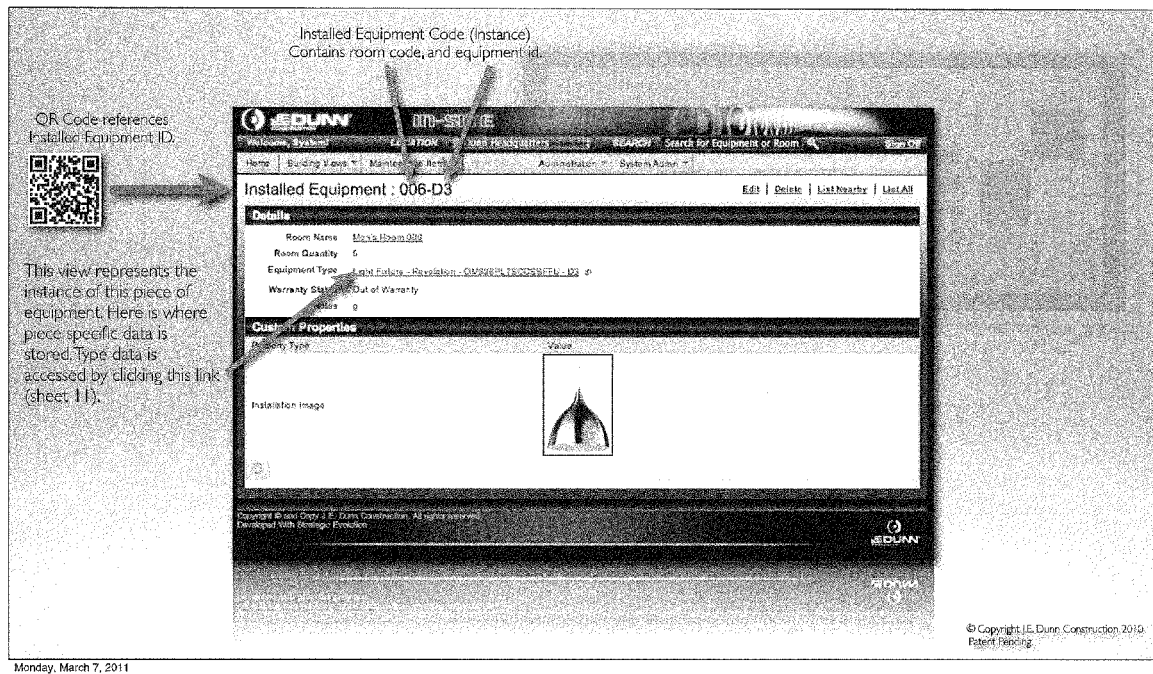
FIG. 18 is an illustration of the installed equipment view.
Figure 19:
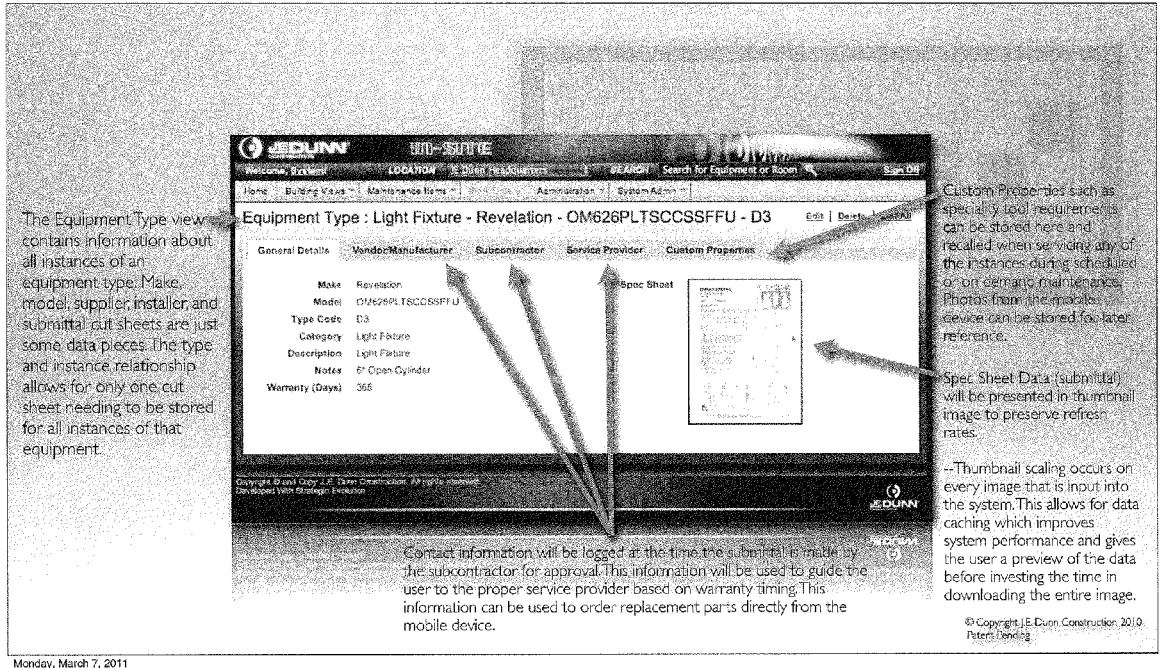
FIG. 19 is an illustration of the equipment type view.
Figure 20:
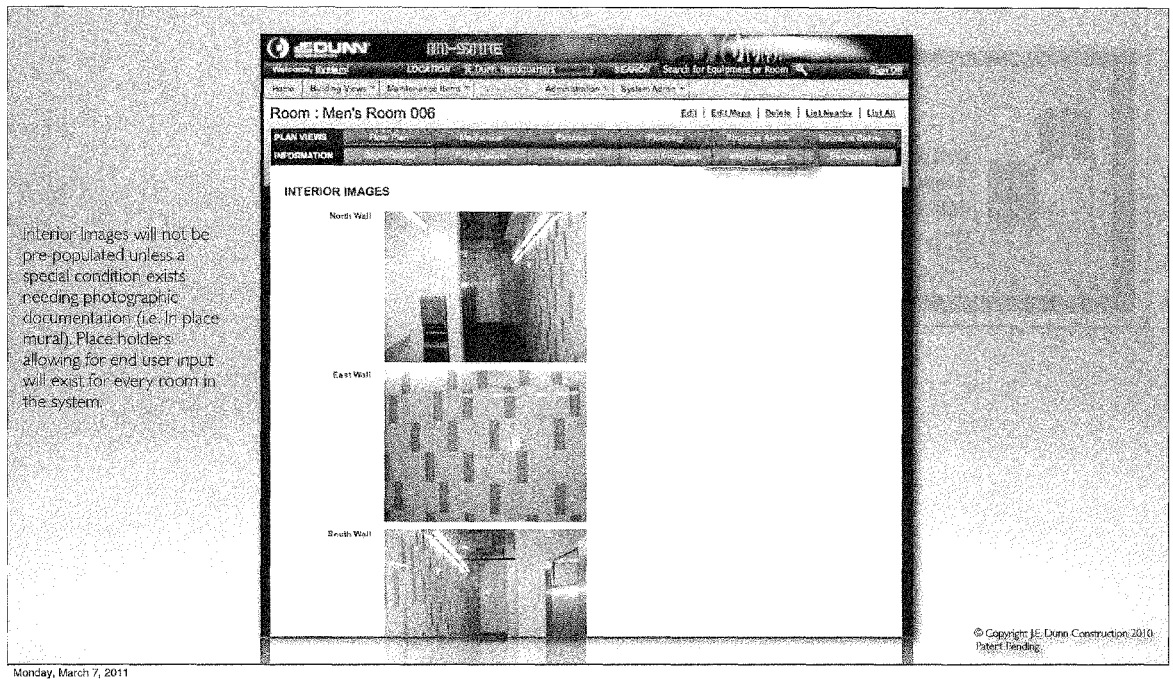
FIG. 20 is an illustration of interior images.
Figure 21:
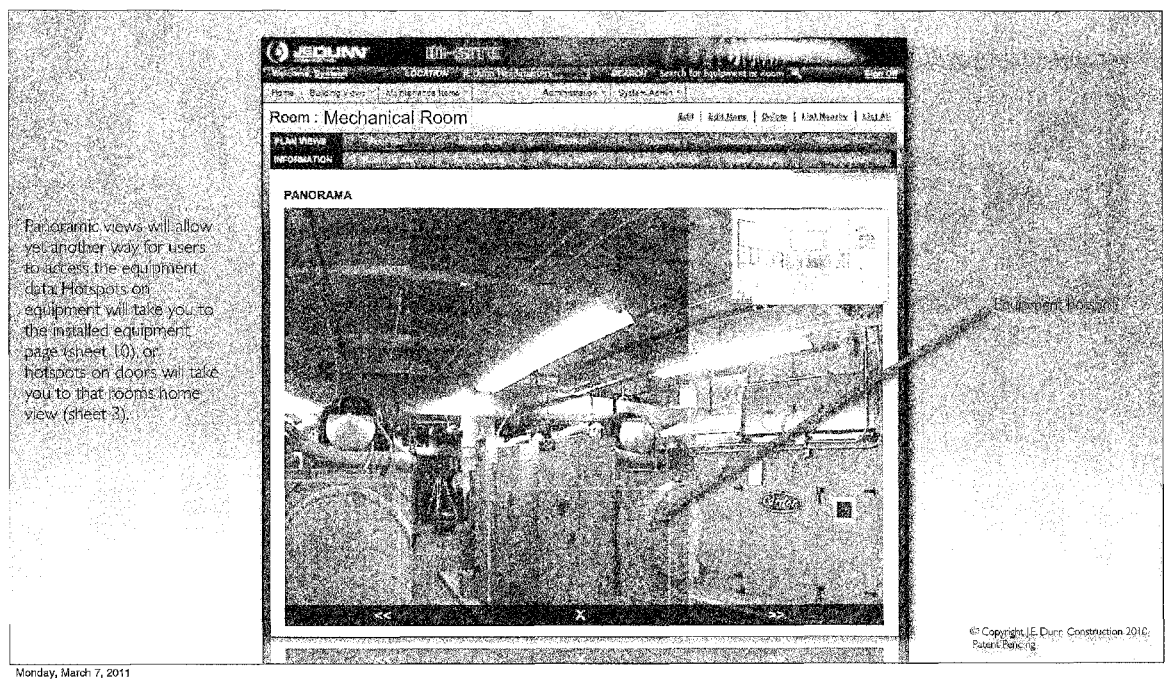
FIG. 21 is an illustration of a panoramic view.

FIG. 17 is an illustration of a list of equipment installed in the room. Any given item in the list shown in FIG. 17 can be selected and further detail can be provided as illustrated by FIG. 18. Equipment type information as well as custom properties can be further viewed as illustrated by FIGS. 19, 20 and 21.

Figure 22:
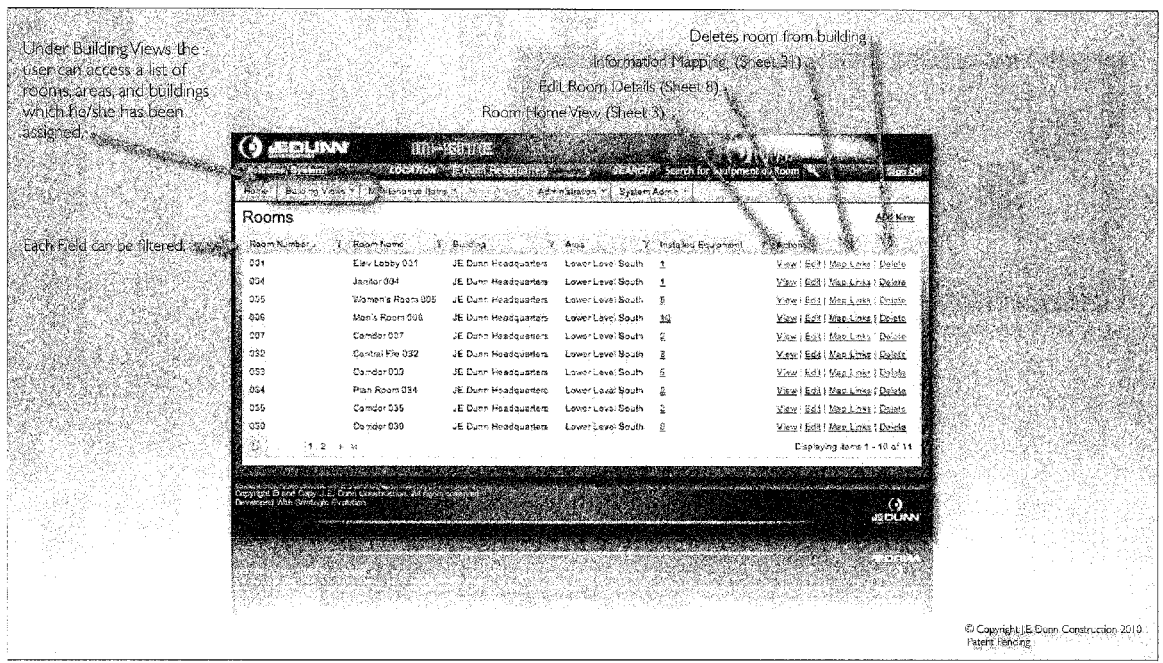
FIG. 22 is an illustration of a list of rooms under the building view.
Figure 23:
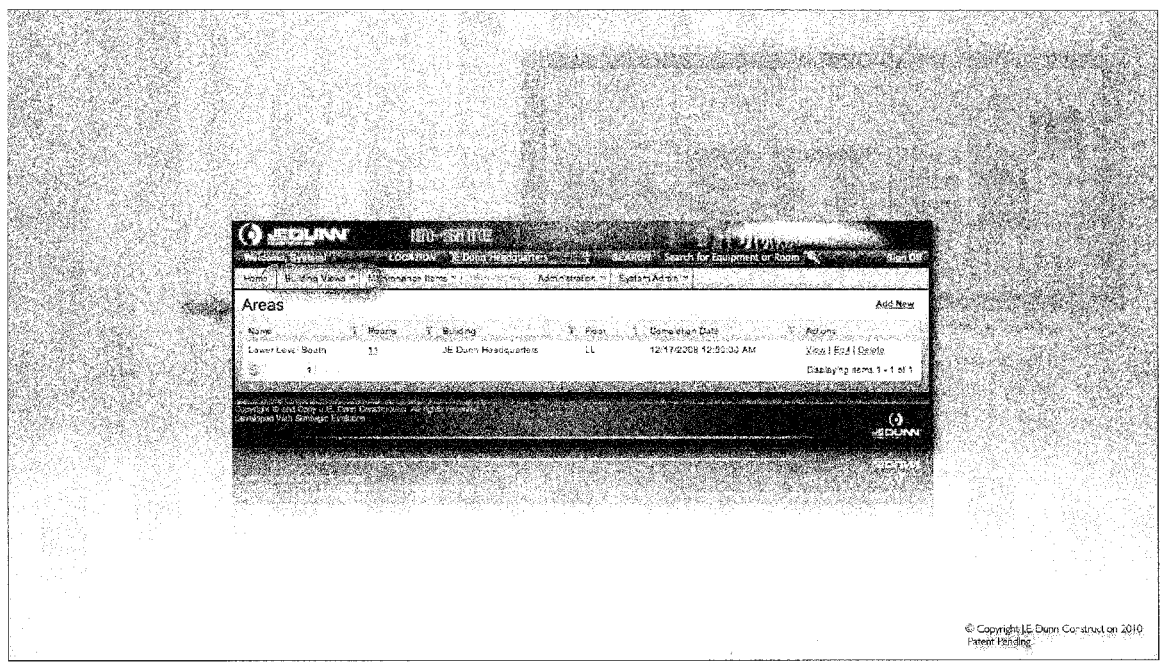
FIG. 23 is an illustration of a list of areas under a building view.
Figure 24:
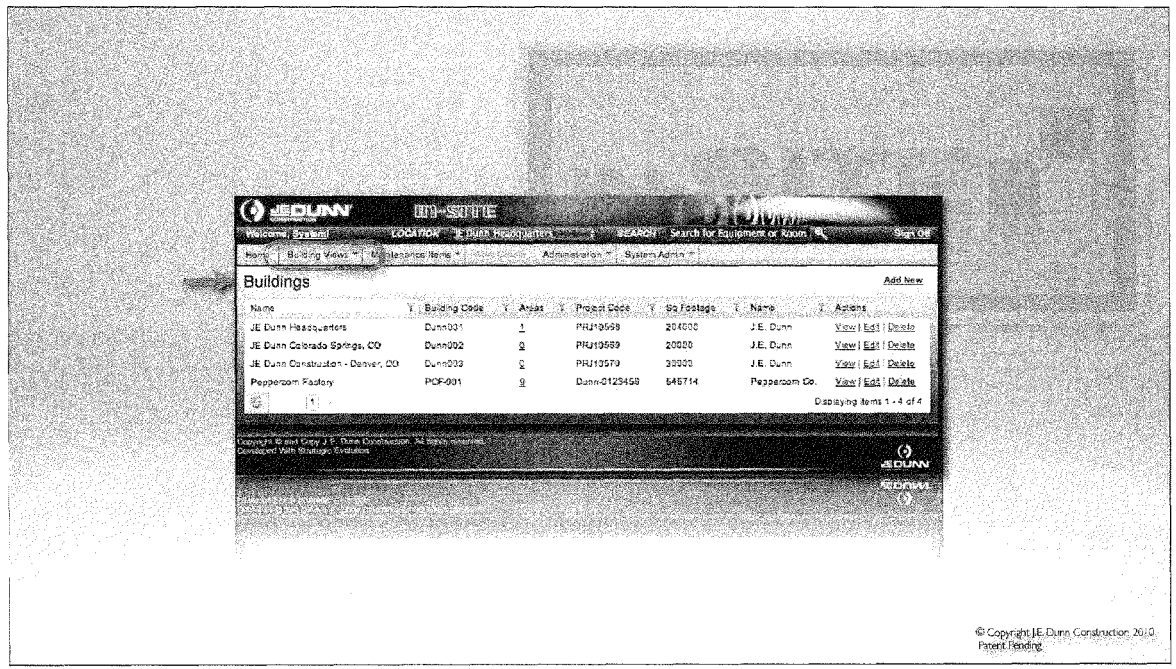
FIG. 24 is an illustration of various buildings seen under an account.

If a user does not navigate directly to a room home view based on entering a room ID or scanning a QR code, the user can access a list of rooms within a building view and select from that list as illustrated in FIG. 22. Alternatively, the user can navigate to a list of areas within a building view as illustrated by FIG. 23. As discussed above the system is account centric and within a given account there maybe multiple building views for which the user can navigate. FIG. 24 is an illustration of an account having multiple building views.

Figure 26:
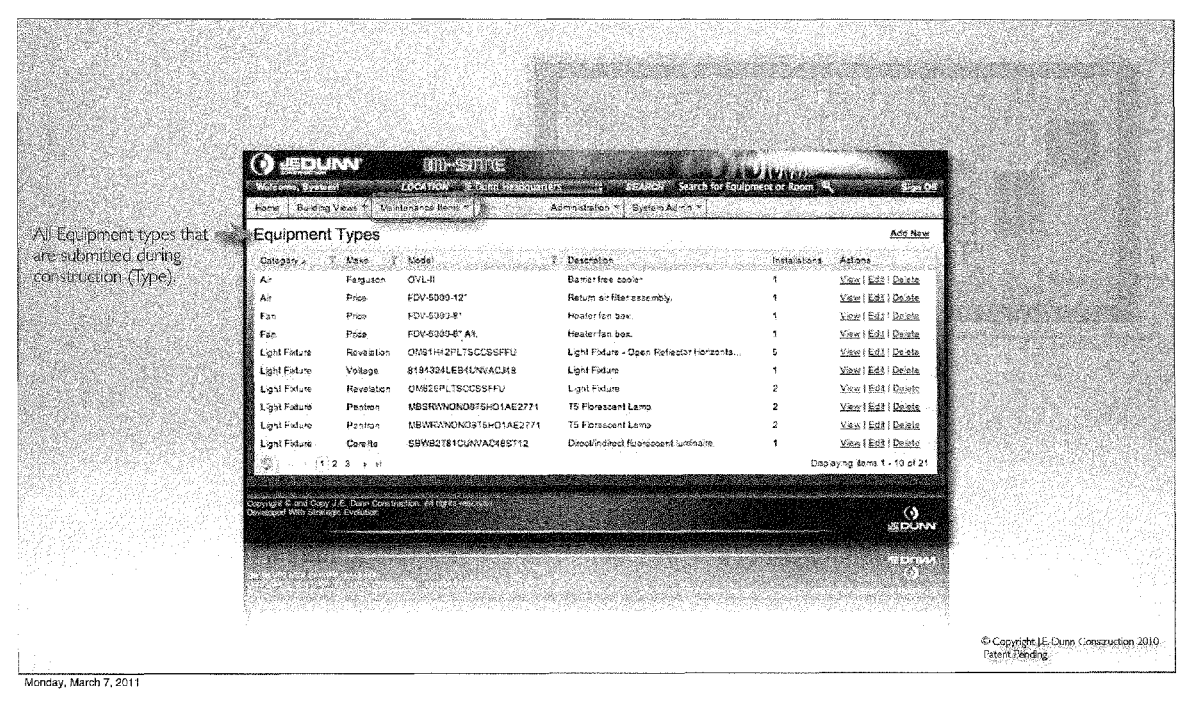
Figure 27:
FIG. 27 is an illustration of installed equipment.

FIG. 25, 26, and FIG. 27 are illustrations of the user's ability to navigate among various maintenance items including a part category, an equipment type category, and an installed equipment category. The part category is illustrated in FIG. 25 which is a list of consumable items like paint, tile and carpet. These items are pre-loaded during the construction phase and can be modified or wholly substituted later by changing the equipment type or installed equipment details. Parts can then be assigned to the finished types such as floor in the case of carpeting, North wall in the case of paint, etc. FIGS. 26 and 27 are an illustration of the equipment type list and installed equipment list respectively.

Figure 28:
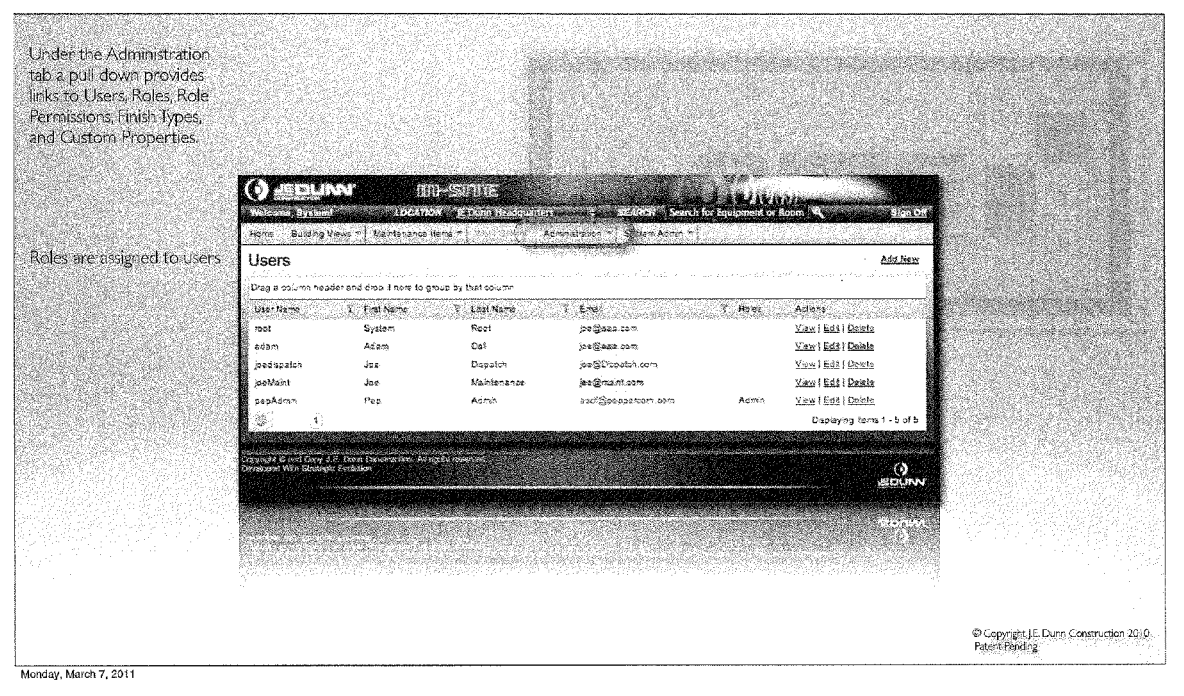
Figure 29:
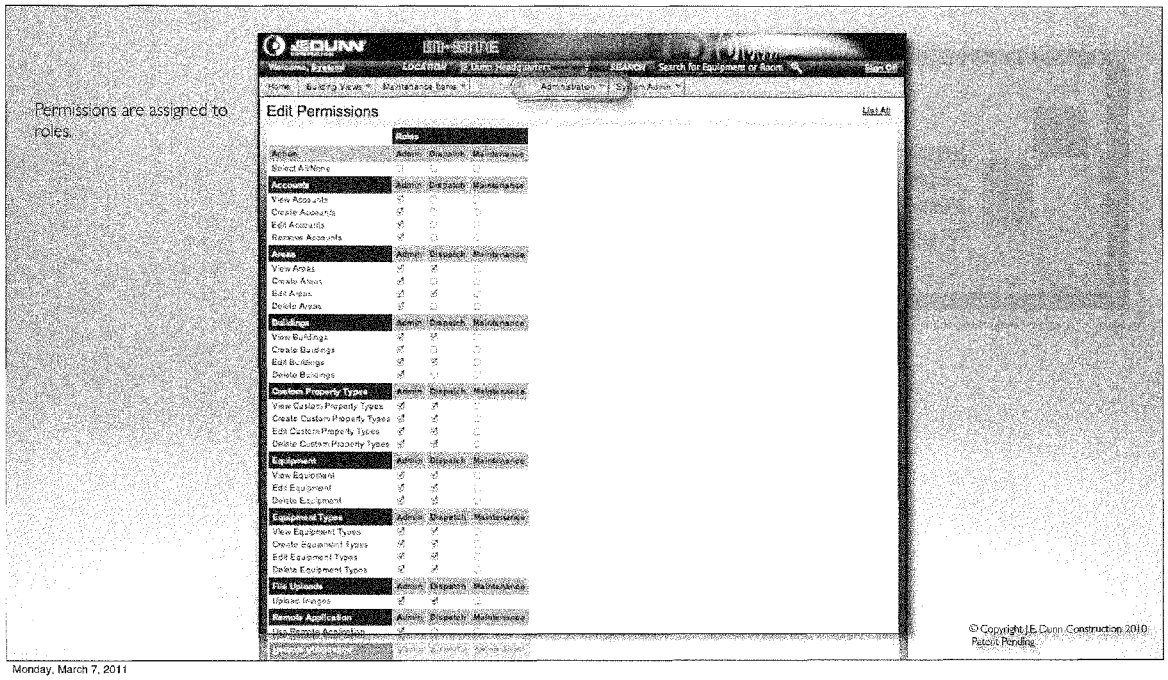
Figure 30:
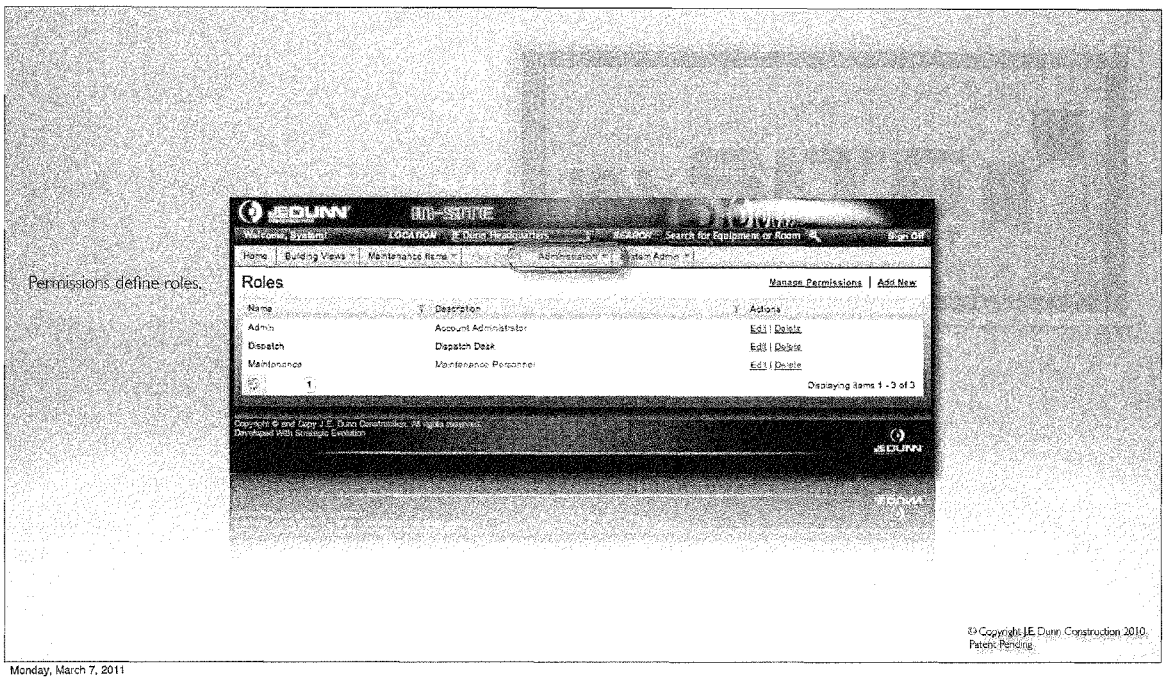

FIGS. 28 through 33 are an illustration of the user administration function which provides links to the user function, the role function, the role permission function, the finish type function and the custom properties function. Within the role function, roles are assigned to users as illustrated by FIG. 28. FIG. 29 is an illustration of the permissions that are assigned to each role. The level of permissions provided define the role, such as admin dispatch or maintenance, as reflected in FIG.

Figure 31:
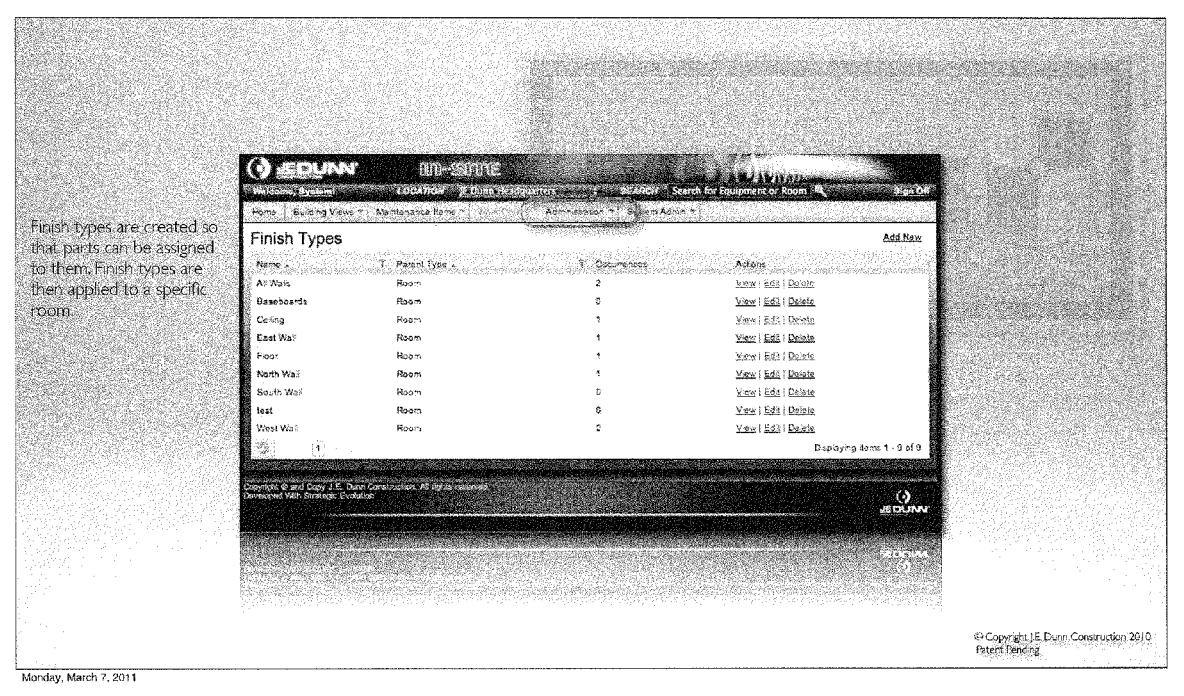

30. The finish types are created so that parts can be assigned them. The finish types are applied to a specific room as illustrated in FIG. 31.

Figure 32:
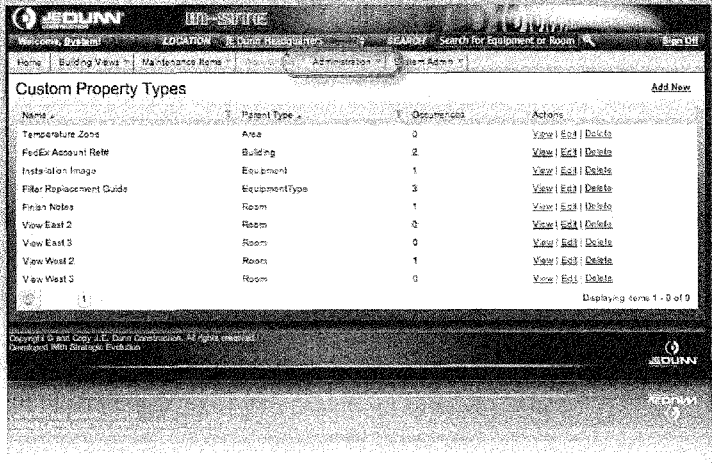
Figure 33:
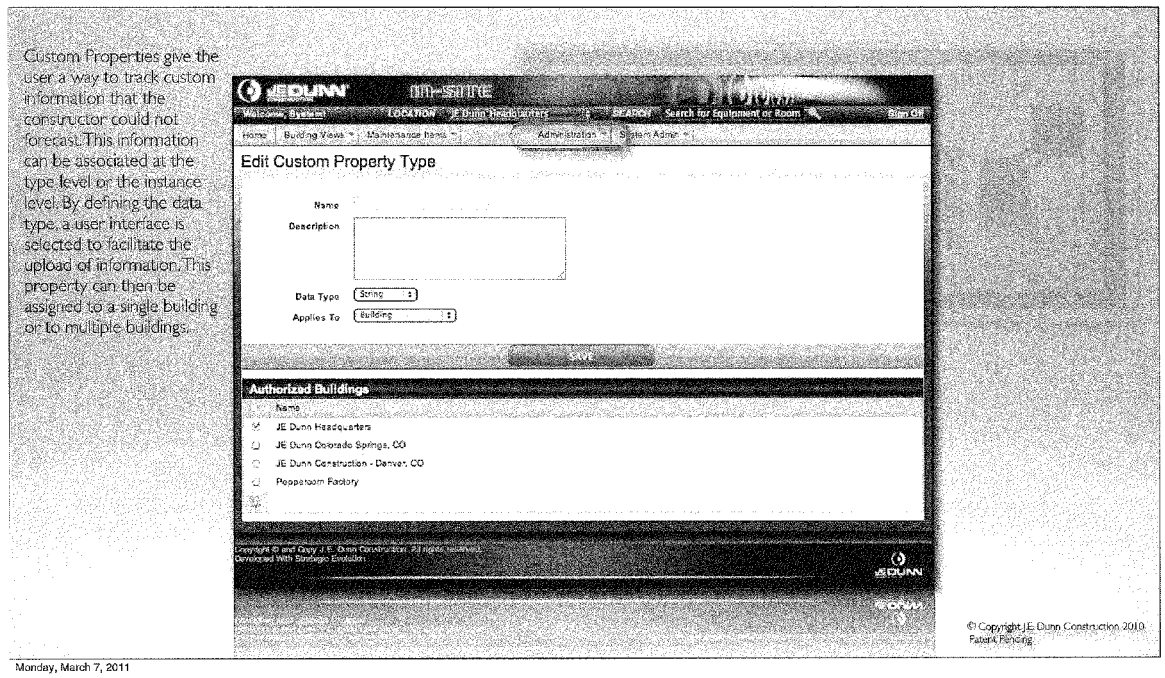

FIGS. 32 and 33 are illustration of the custom properties within the administrative function. Custom properties enable dynamic extension of information that can be associated to buildings, rooms, areas, installed equipment, equipment types, or parts. Remarks, notes, images, data strands, and data files are all supported as data types. Custom properties give the user a way to track custom information that the constructor could not forecast. This information can be associated at the type level or at the instance level. By defining the data type a user interface is selected to facilitate the upload of information. This property can then be assigned to a single building or multiple buildings.

In addition to the ability to add custom properties, the FCS can also provide additional functionality of the system with regards to asset management. The FCS can allow for Company owned equipment, artwork and furnishings to be stored for each room in the system. In the same way equipment is associated with a room, Assets can be linked as well.

Figure 34:
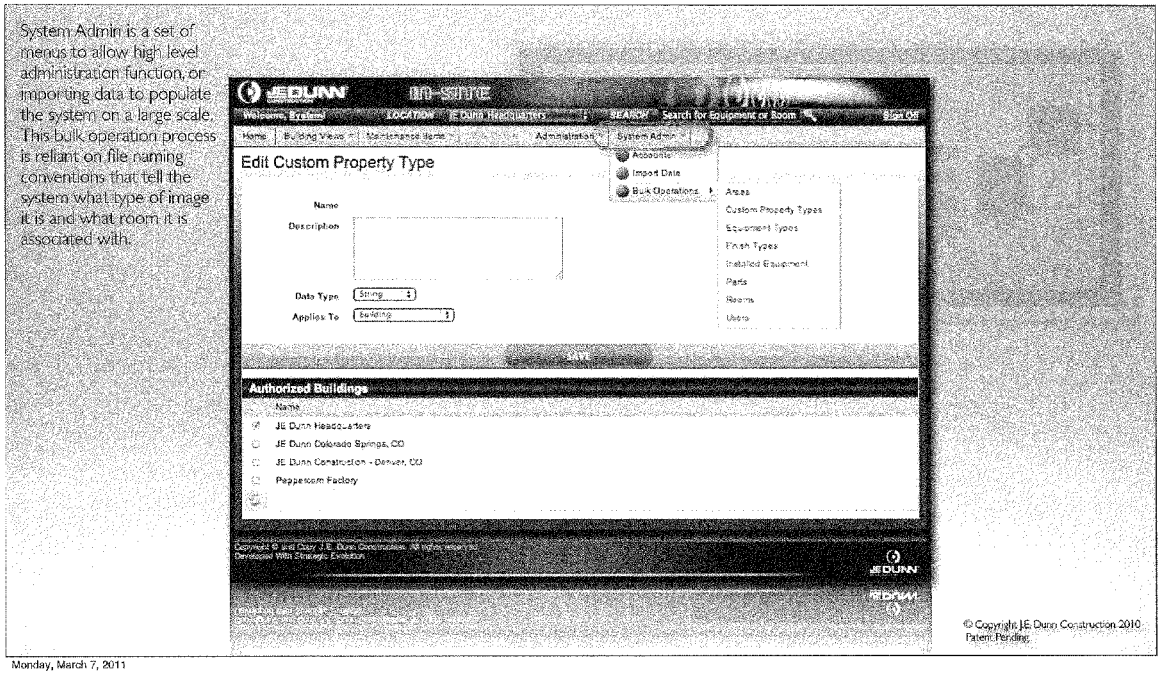
FIGS. 34 thru 39 are illustrations of the system administration functions.

FIG. 34 is an illustration of the system administration function which is a set of menus to allow high level administration or importing of data to populate the system on a large scale. This bulk operation process relies upon file naming conventions that tell the system what type of image it is and what room it is associated with.

Figure 35:
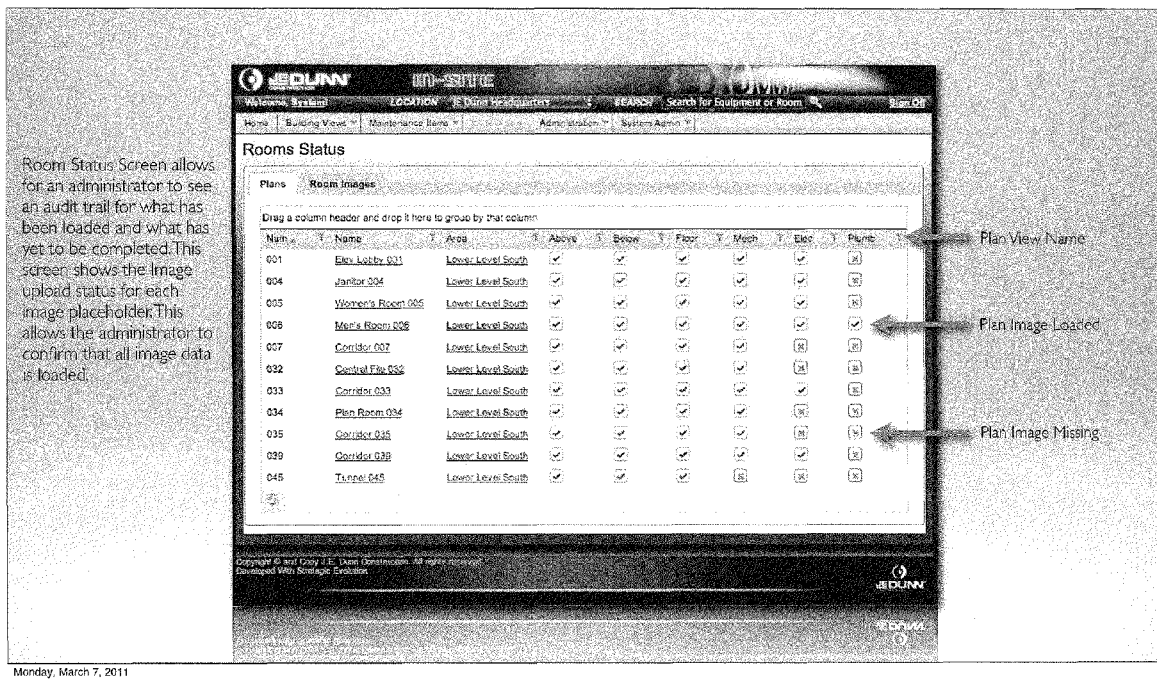
Figure 36:

FIGS. 35 and 36 are an illustration of audit functions under the system administration function. The room status screen as shown in FIG. 35 allows a system administrator to see an audit trail for what has been loaded and what has yet to be completed. This allows the administrator to confirm that all image data is loaded. FIG. 36 is an illustration of a more detailed audit report of a finished schedule import process generated ahead of each import. This allows the administrator to verify the creation of all necessary rooms and areas before the data is loaded into the system.

Figure 37:
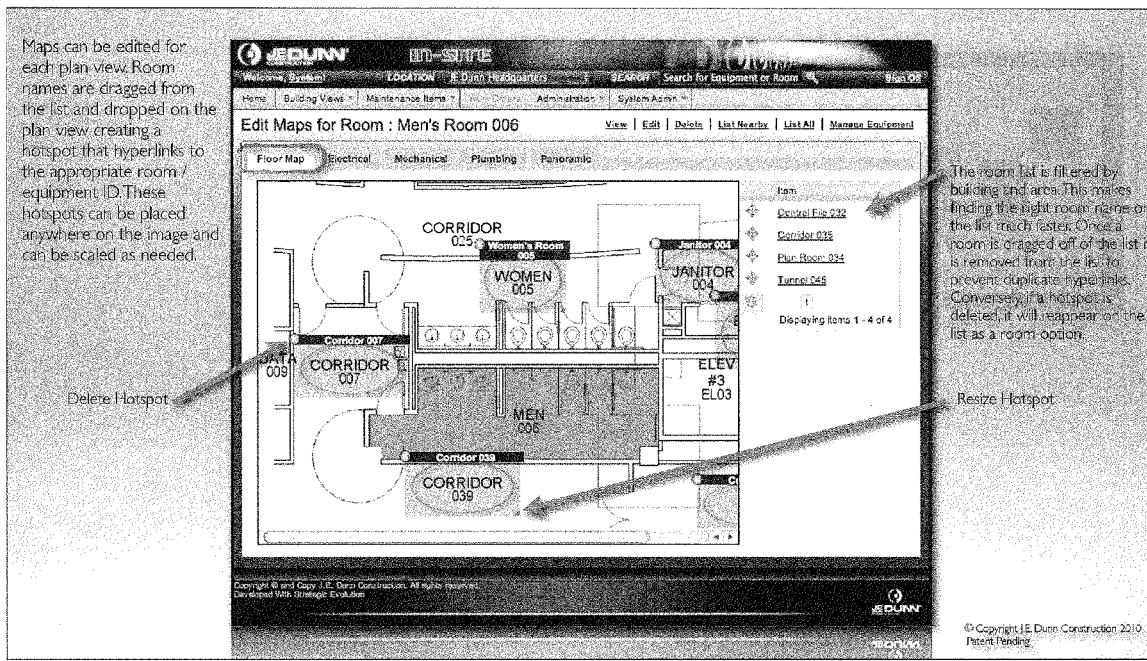
Figure 38:
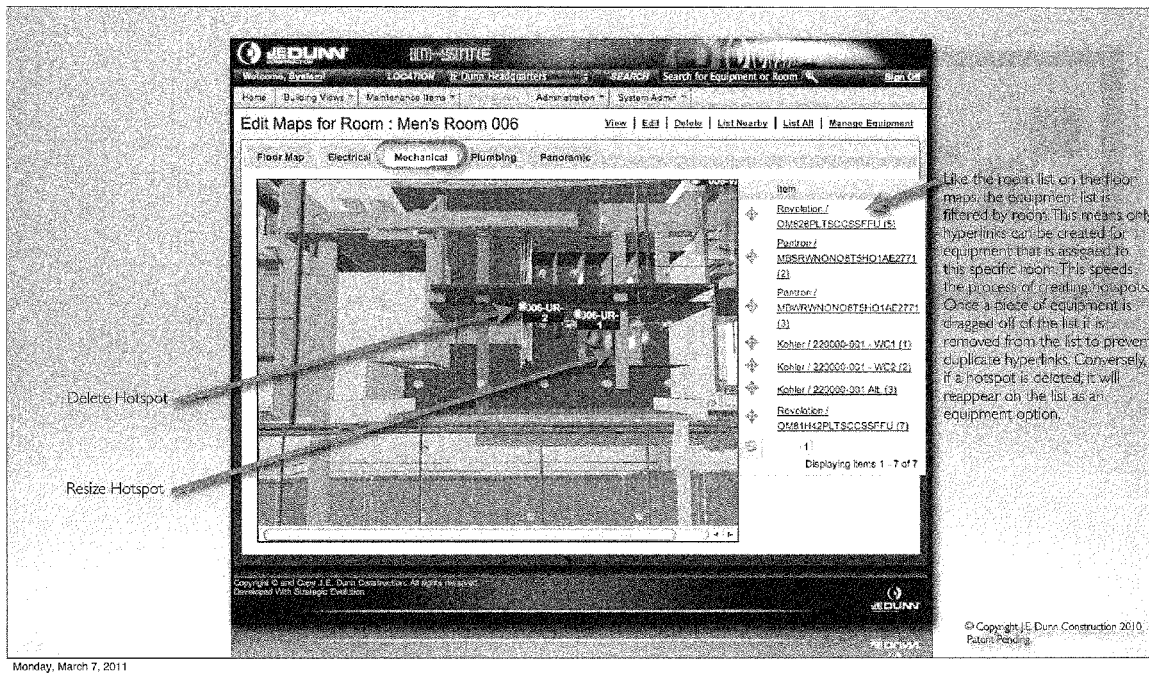
Figure 39:
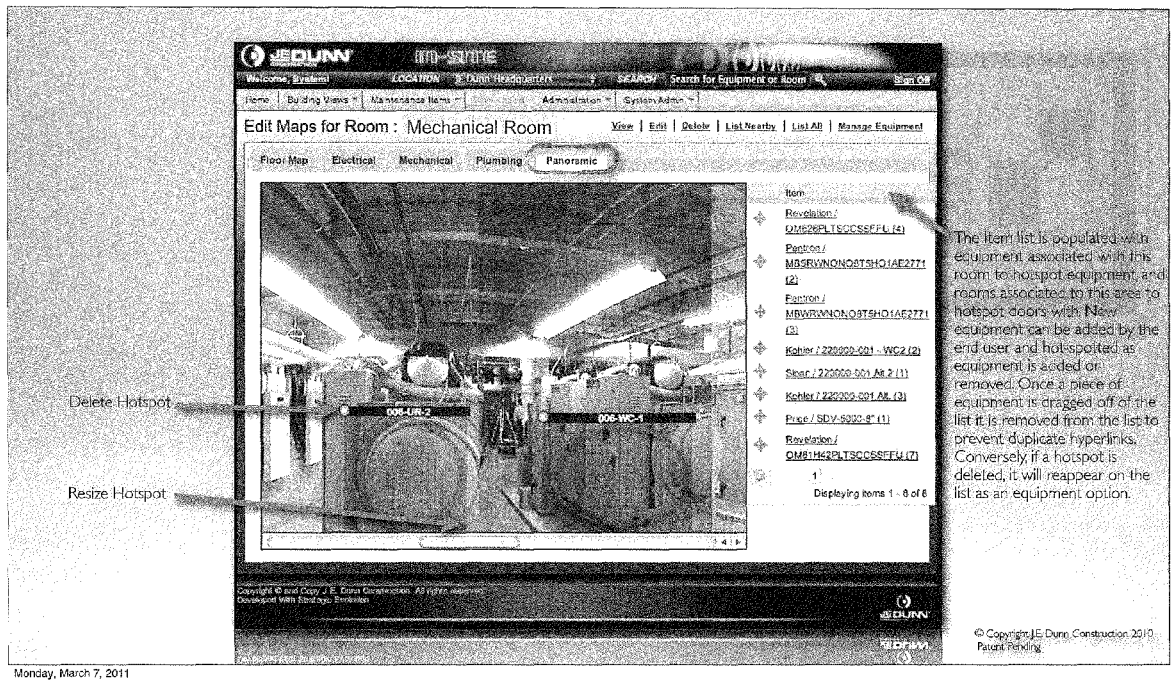
Figure 40:
FIGS. 40 and 41 are illustrations of the mobile device application.
Figure 41:
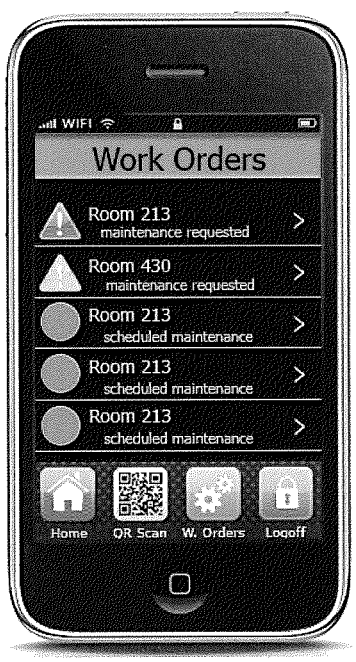

FIGS. 37, 38 and 39 are an illustration of the various edit functions available to the system administrator. FIGS. 40 and 41 are an illustration of a typical view seen on a mobile device for accessing room views and work orders. These mobile devices can be made available to various maintenance personnel for accessing various room information including equipment information and work order schedules.

One practical application and embodiment of the present invention is an FCS network server communicably coupled to a customer client network comprising a content network server having executable content ERP systems and web services applications residing thereon.

The FCS network server can be communicably coupled with a file server function, a database server function with associated computer readable storage medium and data structure, a legacy project construction management application server function with associated computer readable storage medium, and an administrator computer work station operable to execute the ERP systems and web services applications to thereby pre-populate the database server function content with detailed design and construction data during the construction project. a customer client network web server communicably coupled to communicably coupled via a local are network to a customer computer work station having a computer executable browser based user interface application residing thereon and to a mobile computing device having a computer executable mobile browser based user interface application residing thereon, and where said customer client network web server is communicably coupled via a wide area network to said content network server and where said customer computer work station is operable to execute the ERP systems and web services applications to thereby maintain content.

The facility content system network server communicably coupled to a customer client network can further comprise a computer executable web based portal interface application executable by the administrator computer work station for pre-population of the database server function content. When executed, the web based portal application can be operable for users, including project managers and subcontractors, to access via a single point of entry the ERP systems in order to submit for pre-population the detailed design and construction data in a uniform manner during the construction project, where the detailed design and construction data collected in the portal is selectively pushed or pulled to other systems as required.

The detailed design and construction data submitted during the construction project can include equipment data, and, during data submission, the web based portal interface application can be operable to generate a reference code for each piece of equipment and associate the reference code to each piece of equipment, where the reference code identifies product information and room location. The web based portal interface application can be operable to capture original submittals including tabular data and product information sheets.

The web based portal interface application can be operable to capture original submittals including spec sheets, floor plans, shop drawings, notes, equipment support documents, vendor information, finish types, images and equipment manufacturer information.

One application of the invention can include a method for managing facility content data for building management in a customer client network environment comprising the steps of executing content ERP systems and web services applications residing on a content network server communicably coupled with a file server function, a database server function with associated computer readable storage medium and data structure, a legacy project construction management application server function with associated computer readable storage medium and an administrator computer work station. The method can also include pre-populating the database server function content with detailed design and construction data during the construction project by executing the ERP systems and web services applications.

A user can initiate executing a computer executable browser based user interface application residing on a customer client network web server communicably coupled to a customer computer work station where said customer client network web server is communicably coupled via a local are network and coupled to a mobile computing device. The customer client network web server can be communicably coupled via a wide area network to said content network server.

The method can further include the steps of executing a computer executable mobile browser based user interface application residing on said mobile device and executing the ERP systems and web services applications using said customer computer work station to thereby maintain content. Executing the computer executable browser based user interface application residing on a customer client network web server and executing the computer executable mobile browser based user interface application can allow a user to display, view and manipulate facility content data.

The various FCS examples shown above illustrate a novel system and method. A user of the present invention may choose any of the above embodiments, or an equivalent thereof, depending upon the desired application. In this regard, it is recognized that various forms of the subject invention could be utilised without departing from the spirit and scope of the present invention.

As is evident from the foregoing description, certain aspects of the present invention are not limited by the particular details of the examples illustrated herein, and it is therefore contemplated that other modifications and applications, or equivalents thereof, will occur to those skilled in the art. It is accordingly intended that the claims shall cover all such modifications and applications that do not depart from the sprit and scope of the present invention.

Other aspects, objects and advantages of the present invention can be obtained from a study of the drawings, the disclosure and the appended claims.

What is claimed is:

1. A facility content system network server communicably coupled to a customer client network comprising:
    a content network server having executable content enterprise resource planning systems and web services applications residing thereon and communicably coupled with a file server function, a database server function with associated computer readable storage medium and data structure, a legacy project construction management application server function with associated computer readable storage medium and an administrator computer work station operable to execute the enterprise resource planning systems and web services applications to thereby populate the database server function content with detailed design and construction data submitted during the construction project;
    a computer executable web based portal interface application executable by the administrator computer work station for population of the database server function content and when executed is operable for users to submit the detailed design and construction data during the construction project, where the enterprise resource planning systems and web services applications are operable to sort each piece of data within the database server function content for relevance for the facility content system network server and the web based portal interface application is operable to assign each relevant data an asset reference name using a naming convention to normalize each relevant data and to assign each relevant data an asset room location and further where each data and each asset room location having the capability to apply at least one custom property data type to each data or each asset room location where the custom property date type is one of a text, an image, a PDF file, a string, a number, an image file or a datetime and further where each asset room location having at least one hotspot where the hotspot provides a hyperlink to access work order history, navigate to a different room, cross multiple floors, access finishes, or access equipment data; and
    a customer client network web server communicably coupled-via a local area network to a customer computer work station having a computer executable browser based user interface application residing thereon and to a mobile computing device having a computer executable mobile browser based user interface application residing thereon, and where said customer client network web server is communicably coupled via a wide area network to said content network server and where said customer computer work station is operable to execute the enterprise resource planning systems and web services applications (i) to thereby maintain and update content, and (ii) to generate and manage work orders, manage building maintenance, and determine duplication of any work orders and delete any duplicated work orders.

2. The facility content system network server communicably coupled to a customer client network as recited in claim 1, where the computer executable web based portal interface application when executed is operable for users, including project managers, architects, project coordinators, vendors, and subcontractors, to access a single point of entry for the enterprise resource planning systems to submit for population the detailed design and construction data in a uniform manner during the construction project, where the detailed design and construction data collected in the portal is selectively pushed or pulled to other systems as required.

3. The facility content system network server communicably coupled to a customer client network as recited in claim 2, where the detailed design and construction data submitted during the construction project includes equipment data and during data submission the web based portal interface application is operable to generate a reference code for each piece of equipment and associate the reference code to each piece of equipment, where the reference code identifies product information.

4. The facility content system network server communicably coupled to a customer client network as recited in claim 2, where the web based portal interface application includes a review and mark up tool, where the mark up tool allows the user to mark up data and store the marked up data in the database server function.

5. The facility content system network server communicably coupled to a customer client network as recited in claim 2, where the web based portal interface application is operable to capture original submittals including tabular data and product information sheets.

6. The facility content system network server communicably coupled to a customer client network as recited in claim 5, where the web based portal interface application is operable to capture original submittals including spec sheets, floor plans, shop drawings, notes, equipment support documents, vendor information, finish types, images and equipment manufacturer information.

7. The facility content system network server communicably coupled to a customer client network as recited in claim 6, where population of the database server function content with detailed design and construction data is with an account centric data structure where the data is segregated by a building, an area within the building and a room within the area.

8. The facility content system network server communicably coupled to a customer client network as recited in claim 7, where each room has associated thereto data representative of a corresponding mechanical system view, electrical system view, plumbing view, floor plan view and key plan view.

9. The facility content system network server communicably coupled to a customer client network as recited in claim 1, where the operability of said customer computer work station is further operable to execute the enterprise resource planning systems and web services applications to (a) access each data from the work order, (b) create custom filter sets for managing work orders, (c) create work orders that have a series of pass/fail tasks that must be completed before the work order is marked and saved as completed, and (d) send notifications relating to the work orders and building maintenance to a plurality of e-mail contacts stored in the database server function content.

10. The facility content system network server communicably coupled to a customer client network as recited in claim 1, where each room has associated thereto data representative of adjacent room views and key plan views.)

11. A facility content system network server communicably coupled to a customer client network comprising:
   facility content system data associated with equipment, finish types, images and custom properties stored in a computer readable medium with an account centric data structure where the data is segregated by a building, an area within the building and a room within the area, where the facility content system data is initially populated using data generated by a legacy project construction application and design and construction data inputs from a building information model;
   a computer executable web based portal interface application executable by an administrator computer work station for population of the facility content system data and when executed is operable for users to input design and construction data inputs, where the web based portal interface application is operable to assign each piece of data an asset reference name using a naming convention to normalize each piece of data and to assign each piece of data an asset room location and further where each data and each asset room location having the capability to apply at least one custom property data type to each data or each asset room location where the custom property date type is one of a text, an image, a PDF file, a string, a number, an image file or a datetime and further where each asset room location having at least one hotspot where the hotspot provides a hyperlink to access work order history, navigate to a different room, cross multiple floors, access finishes, or access equipment data; and
   a user interface client application having a navigation schema adapted to access building objects, area objects grouped within said building objects, room objects grouped within said area objects and equipment instances within said room objects, and where said user interface client application is operable when executed to access said objects and display images representative of content data within said objects and further where said user interface client application is operable when executed to generate and manage work orders, manage building maintenance, and determine duplication of any work orders and delete any duplicated work orders.

12. The facility content system network server communicably coupled to a customer client network as recited in claim 11, where within said room objects is an association to data representative of items including structure, plumbing systems, mechanical systems, electrical systems, equipment and facility information.

13. The facility content system network server communicably coupled to a customer client network as recited in claim 11, where the computer executable web based portal interface application when executed is operable for users, including project managers, architects, project coordinators, vendors, and subcontractors, to access a single point of entry for the enterprise resource planning systems to submit for populating the facility content system data including detailed design and construction data in a uniform manner during the construction project, where the detailed design and construction data collected in the portal is selectively pushed or pulled to other systems as required.

14. The facility content system network server communicably coupled to a customer client network as recited in claim 13, where the detailed design and construction data submitted includes equipment data and an associated reference code for each piece of equipment, where the reference code identifies product information.

15. The facility content system network server communicably coupled to a customer client network as recited in claim 13, where the detailed design and construction data is selectively pulled from content enterprise resource planning systems.

16. The facility content system network server communicably coupled to a customer client network as recited in claim 15, where the web based portal interface application is operable to capture original submittals including spec sheets, floor plans, shop drawings, notes, equipment support documents, vendor information, finish types, images and equipment manufacturer information.

17. The facility content system network server communicably coupled to a customer client network as recited in claim 16, where population of the detailed design and construction data is with an account centric data structure where the data is segregated by a building, an area within the building and a room within the area.

18. The facility content system network server communicably coupled to a customer client network as recited in claim 17, where each room has associated thereto data representative of a corresponding mechanical system view, electrical system view, plumbing view, floor plan view and key plan view.

19. The facility content system network server communicably coupled to a customer client network as recited in claim 17, where each room has associated thereto data representative of an adjacent room.

20. The facility content system network server communicably coupled to a customer client network as recited in claim 17, where the user interface client application is operable when executed to (a) access each data from the work order, (b) create custom filter sets for managing work orders, (c) create work orders that have a series of pass/fail tasks that must be completed before the work order is marked and saved as completed, and (d) send notifications relating to the work orders and building maintenance to a plurality of e-mail contacts stored in the database server function content.

21. A facility content system network server communicably coupled to a customer client network comprising:
   a computer executable browser based user interface application stored on a computer readable medium of a web server communicably coupled to a wide area network, where said user interface application can be accessed by a work station communicably coupled to the wide area network where said work station is operable to initiate execution of said user interface application and selectively navigate from a home page, using a navigation schema of said user interface, to view and interface with various pages within the site map navigation tree, where said various pages include a building view page, a service requests view page and a building administration page and to generate and manage work orders, manage building maintenance, and determine duplication of any work orders and delete any duplicated work orders; and
   where when said user interface is executed is operable to retrieve facility content system data associated with equipment, finish types, images and custom properties stored in a computer readable medium of a relational database initially populated using data generated by a legacy project construction application and design and construction data inputs from a building information model where the custom properties are one of one of a text, an image, a PDF file, a string, a number, an image file or a datetime and said user interface application further operable to populate fields within the various pages and operable to allow a user to provide inputs for updating or adding to said facility content system data and further operable to assign each data input an asset reference name using a naming convention to normalize each data input and to assign each data input an asset room location where each asset room location having at least one hotspot where the hotspot provides a hyperlink to access work order history, navigate to a different room, cross multiple floors, access finishes, or access equipment data.

22. The facility content system network server communicably coupled to a customer client network as recited in claim 21, where within the site map navigation tree under the building view is an area view page and under the area view page is a room view page.

23. The facility content system network server communicably coupled to a customer client network as recited in claim 21, where within a room view page are adjacent room views and thumbnail key plan views functionally hyperlinked to a full-size key plan view.

24. The facility content system network server communicably coupled to a customer client network as recited in claim 21, where within a room view page are hyperlinks to equipment information for equipment located in the room.

25. The facility content system network server communicably coupled to a customer client network as recited in claim 21, where under the room view is an electrical view, mechanical view, plumbing view, floor plan view and key plan view.

26. The facility content system network server communicably coupled to a customer client network as recited in claim 21, where under the room view is a work order history view.

27. The facility content system network server communicably coupled to a customer client network as recited in claim 21, where under the service request view page (a) each data input can be accessed from the work order, (b) a custom filter set can be created for managing work orders, and (c) work orders can have a series of pass/fail tasks that must be completed before the work order is marked and saved as completed.

28. The facility content system network server communicably coupled to a customer client network as recited in claim 21, where within the building administration page functionality is functionality provided for retrieving, viewing, updating and managing facility content system data.

29. The facility content system network server communicably coupled to a customer client network as recited in claim 28, where within the building administration page functionality is functionality provided for generating and storing custom properties.

30. The facility content system network server communicably coupled to a customer client network as recited in claim 21, where within various pages within the site map navigation tree is a system administration page operable to view, update and manage user and account information and send notifications relating to the work orders and building maintenance to a plurality of e-mail contacts stored in the database server function content.

* * * * *